(12) United States Patent
Iwasawa et al.

(10) Patent No.: US 7,244,549 B2
(45) Date of Patent: Jul. 17, 2007

(54) PATTERN FORMING METHOD AND BILAYER FILM

(75) Inventors: Haruo Iwasawa, Tokyo (JP); Akihiro Hayashi, Tokyo (JP); Tsutomu Shimokawa, Tokyo (JP); Kazuo Kawaguchi, Tokyo (JP); Masato Tanaka, Tokyo (JP)

(73) Assignee: JSR Corporation, Tokyo (JP)

( * ) Notice: Subject to any disclaimer, the term of this patent is extended or adjusted under 35 U.S.C. 154(b) by 634 days.

(21) Appl. No.: 10/226,321

(22) Filed: Aug. 23, 2002

(65) Prior Publication Data

US 2003/0073040 A1 Apr. 17, 2003

(30) Foreign Application Priority Data

Aug. 24, 2001 (JP) ............................ 2001-254699

(51) Int. Cl.
 *G03C 1/825* (2006.01)
 *G03F 7/039* (2006.01)
 *G03F 7/20* (2006.01)

(52) U.S. Cl. ............... 430/326; 430/270.1; 430/271.1; 430/905

(58) Field of Classification Search ............ 430/271.1, 430/326, 270.1, 905, 914
See application file for complete search history.

(56) References Cited

U.S. PATENT DOCUMENTS

| | | | | |
|---|---|---|---|---|
| 5,401,614 A | * | 3/1995 | Dichiara et al. | 430/323 |
| 5,882,844 A | * | 3/1999 | Tsuchiya et al. | 430/288.1 |
| 5,972,560 A | * | 10/1999 | Kaneko et al. | 430/270.1 |
| 6,066,433 A | * | 5/2000 | Takemura et al. | 430/270.1 |
| 6,312,481 B1 | * | 11/2001 | Lin et al. | 44/418 |
| 6,531,260 B2 | * | 3/2003 | Iwasawa et al. | 430/270.1 |
| 2004/0191672 A1 | * | 9/2004 | Oguro et al. | 430/270.1 |
| 2005/0145386 A1 | * | 7/2005 | Nguyen et al. | 166/295 |

FOREIGN PATENT DOCUMENTS

| | | | |
|---|---|---|---|
| EP | 1 142 928 A1 | * | 10/2001 |
| JP | 7-172586 | | 7/1995 |
| JP | 9-315335 | | 12/1997 |
| JP | 11-310699 | | 11/1999 |
| JP | 2000-143937 | * | 5/2000 |
| JP | 2001-40293 | * | 2/2001 |
| JP | 2001-109150 | * | 4/2001 |

OTHER PUBLICATIONS

JPO English abstract for JP 2001-40293.*
Derwent English abstract for JP 2000-143937.*
Derwent English abstract for JP 2001-109150 (Uno et al).*
Kunz, et al., "Outlook for 157-nm Resist Design", Journal of Photopolymer Science and Technology, 12, 4, 561-570 (1999).

* cited by examiner

*Primary Examiner*—Sin Lee
(74) *Attorney, Agent, or Firm*—Merchant & Gould, P.C.; Christopher W. Raimund

(57) ABSTRACT

A pattern forming method comprising forming a coating of a radiation-sensitive resin composition, which contains an acid-dissociable group-containing polysiloxane, alkali-insoluble or scarcely alkali-soluble but becoming alkali-soluble when the acid-dissociable group dissociates, on a film containing a polymer with a carbon content of 80 wt % or more and a polystyrene-reduced weight average molecular weight of 500–100,000, an applying radiation to the coating is provided. The method can form minute patterns with a high aspect ratio by suitably selecting a specific etching gas in the dry etching process, without being affected by standing waves.

21 Claims, No Drawings

PATTERN FORMING METHOD AND BILAYER FILM

BACKGROUND OF THE INVENTION

1. Field of the Invention

The present invention relates to a pattern forming method suitable for a lithography process and a bilayer film for forming patterns. The pattern forming method comprises a process of forming a coating, which comprises a radiation-sensitive resin composition containing an acid-dissociable group-containing polysiloxane, onto a film with a high carbon content and irradiating the coating with light such as deep ultraviolet rays, electron beams, and X-rays.

2. Description of the Background Art

A recent strong demand for high density and highly integrated LSIs accelerates miniaturization of wiring patterns.

Using short wave rays in a lithographic process is one method for miniaturizing wiring patterns. In recent years, deep ultraviolet rays typified by a KrF excimer laser (wavelength: 248 nm) or an ArF excimer laser (wavelength: 193 nm), electron beams, Xrays, and the like are being used in place of ultraviolet rays such as g-line (wavelength: 436 nm) and i-line (wavelength: 365 nm).

Novolac resins, poly(vinylphenol), and the like have been used as resin components for conventional resist compositions. However, since these resins exhibit strong absorbance at a wavelength of 193 nm due to inclusion of aromatic rings in the structure, a lithographic process by an ArF excimer laser using these resins cannot provide high accuracy corresponding to high photosensitivity, high resolution, and a high aspect ratio.

Therefore, a resin for use in a resist, transparent to a wavelength of 193 nm or less, particularly to a wavelength of 193 nm and 157 nm, and exhibiting excellent dry etching resistance equivalent to or better than aromatic rings has been desired. A polysiloxane is one such a polymer. R. R. Kunz et al. of the MIT have reported their research results showing excellent transparency of a polysiloxane at a wavelength of 193 nm or less, particularly at 157 nm, describing superiority of this polymer as a resist in a lithographic process using radiation with a wavelength of 193 nmor less (J. Photopolym. Sci. Technol., Vol. 12, No. 4, 1999). Moreover, polysiloxanes are known to exhibit excellent dry etching resistance. In particular, a resist containing polyorganosilsesquioxane having a ladder structure is known to possess high plasma resistance.

Several resist materials using a siloxane polymer have also been reported. For example, Japanese Patent Publication Laid-open No. 323611/1993 discloses a radiation-sensitive resin composition comprising a polysiloxane having an acid-dissociable group such as a carboxylic acid ester group, phenol ether group, etc., on the side chain, bonded to a silicon atom via one or more carbon atoms. Since this polysiloxane is a homopolymer, resolution cannot be increased if the acid-dissociable carboxylic acid ester group on the side chain does not efficiently dissociate. If a large number of acid-dissociable groups dissociate, on the other hand, the curing shrinkage stress of the resist film increases, causing cracks and peels in the resist film.

Japanese Patent Application Laid-open No. 160623/1996 discloses a positive tone resist using a polymer in which the carboxyl group of poly(2-carboxyethylsiloxane) is protected with an acid-dissociable group such as a t-butyl group. Since this resist protects the carboxyl groups only insufficiently, it is difficult to develop the resist containing a large amount of carboxylic acid components remaining in the non-exposed area using a common alkaline developing solution.

Japanese Patent Application Laid-open No. 60733/1999 discloses a resist resin composition containing a polyorganosilsesquioxane having an acid-dissociable ester group. This polyorganosilsesquioxane is prepared by the addition reaction of an acid-dissociable group-containing (meth)acryl monomer to a condensation product of vinyl trialkoxysilane, γ-methacryloxypropyltrialkoxysilane, or the like. The resin has a problem of insufficient transparency to light with a wavelength of 193 nm or less due to unsaturated groups remaining on the polymer side chains. The patent specification also describes a resist resin composition containing a polymer made by the esterification of polyhydroxycarbonylethylsilsesquioxane with t-butyl alcohol. This polymer also has the same problem as a resist as encountered by the polymer disclosed in Japanese Patent Application Laid-open No. 160623/1996 due to a low degree of carboxyl group protection.

In view of this situation, the inventors of the present invention have conducted extensive studies on resist materials containing a siloxane polymer exhibiting high transparency to light with a wavelength of 193 nm or less. However, the effect of standing waves that are considered to be caused by high transparency of this type of resists to light with a short wavelength cannot be ignored. The high transparency to short wavelength light was found to hinder formation of fine patterns.

One way of controlling the effect of standing waves is to provide an under layer film which can not only lessen the effect of standing waves, but also exhibits sufficient dry etching resistance.

To provide the under layer film with dry etching resistance, it is necessary to reduce the content of elements with high reactivity to the etching gas, such as a hydrogen atom and nitrogen atom, in the polymer composing the under layer film and to increase the content of carbon atom having relatively low reactivity to the etching gas. Conventionally, i-line resists made from a novolac resin have been mainly used for this purpose.

However, i-line resists do not necessarily possess satisfactory dry etching resistance. The resist is significantly eroded when the under layer film for silicon-type oxide films is processed. Reduction of film thickness has been unavoidable. For this reason, a thicker under layer film is used at present. However, since the pattern size is very small in the process with a minute silicon-type oxide film using a KrF excimer laser, an ArF excimer laser, or an F2 excimer laser (wavelength: 157 nm), this method of increasing the thickness of the under layer film inevitably increases the aspect ratio of patterns. As a result, the pattern is easily eroded from the sidewall by etching gas, dwindling away or collapsing. Precise pattern transfer is difficult.

An object of the present invention is to provide a pattern forming method capable of forming minute patterns without being affected by standing waves comprising the combined use of an under layer film with excellent dry etching resistance available as a thin film and a specific polysiloxane-type radiation-sensitive resin composition exhibiting high transparency to light with a wavelength of 193 nm or less, particularly, wavelength of 193 nm and 157 nm, and also capable of forming resist patterns with a high aspect ratio by suitably selecting a specific etching gas in the dry etching process, and also to provide a bilayer film.

SUMMARY OF THE INVENTION

The pattern forming method of the present invention comprises steps of:

providing a film containing a polymer with a carbon content of 80 wt % or more and a polystyrene-reduced weight average molecular weight of 500–100,000 (hereinafter referred to as "under layer film polymer"), providing a radiation-sensitive resin composition containing an acid-dissociable group-containing polysiloxane which is alkali-insoluble or scarcely alkali-soluble but becomes alkali-soluble when the acid-dissociable group dissociates (hereinafter referred to as "acid-dissociable group-containing polysiloxane"), forming a coating of the radiation-sensitive resin composition on the film, and applying radiation to the coating.

In a preferred embodiment of the above pattern forming method, the above under layer film polymer has a structural unit of the following formula (1),

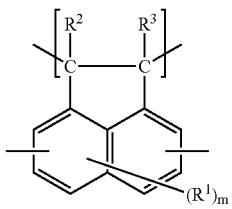

(1)

wherein $R^1$ is a monovalent atom or a monovalent group, m is an integer of 0–4 (provided that when m is 2–4, two or more $R^1$ groups may be either the same or different), and $R^2$ and $R^3$ individually represent a monovalent atom or a monovalent group.

In the above pattern forming method, the acid-dissociable group-containing polysiloxane preferably contains a structural unit of the following formula (2) and/or a structural unit of the following formula (3),

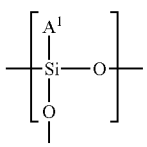

(2)

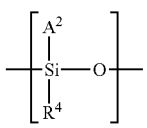

(3)

wherein $A^1$ and $A^2$ individually represent a monovalent organic group having an acid-dissociable group which dissociates by the action of an acid and $R^4$ represents a linear, branched, or cyclic alkyl group having 1–10 carbon atoms or a linear, branched, or cyclic halogenated alkyl group having 1–10 carbon atoms.

In the above pattern forming method, light with a wavelength of 193 nm or 157 nm is preferably used as the radiation.

The bilayer film of the present invention comprises a film containing a polymer with a carbon content of 80 wt % or more and a polystyrene-reduced weight average molecular weight of 500–100,000 and a coated film applied thereon, wherein the coated film is formed from a radiation-sensitive resin composition containing an acid-dissociable group-containing polysiloxane which is alkali-insoluble or scarcely alkali-soluble but becomes alkali-soluble when the acid-dissociable group dissociates.

In a preferred embodiment of the above bilayer film, the polymer with a carbon content of 80 wt % or more and a polystyrene-reduced weight average molecular weight of 500–100,000 contains the structural unit of the above formula (1).

In the above bilayer film, the acid-dissociable group-containing polysiloxane is preferably a polymer having a structural unit of the above formula (2) and/or a structural unit of the above formula (3).

In the above bilayer film, the acid-dissociable group represented by $A^1$ in the formula (2) or $A^2$ in the formula (3) is preferably a group of the following formula (10), $$-P-Q-R^8 \quad (10)$$

wherein P indicates a single bond, methylene group, difluoromethylene group, substituted or unsubstituted, linear or branched alkylene group having 2–20 carbon atoms, substituted or unsubstituted, divalent aromatic group having 6–20 carbon atoms, or substituted or unsubstituted, divalent alicyclic group having 3–20 carbon atoms, Q represents a group —COO— or —O—, and $R^8$ represents a monovalent organic group dissociable by the action of an acid to produce hydrogen atoms.

In the above bilayer film, P in the formula (10) is preferably a divalent hydrocarbon group having a norbornane skeleton or its fluoride.

In the above bilayer film, the radiation-sensitive resin composition preferably comprises an acid-dissociable group-containing polysiloxane and a radiation-sensitive photoacid generator.

In a preferred embodiment, the above bilayer film comprises a film containing the under layer film polymer and a coated film applied thereon, wherein the coated film is formed from a radiation-sensitive resin composition containing an acid-dissociable group-containing polysiloxane which is alkali-insoluble or scarcely alkali-soluble but becomes alkali-soluble when the acid-dissociable group dissociates.

Other objects, features and advantages of the invention will hereinafter become more readily apparent from the following description.

DETAILED DESCRIPTION OF THE INVENTION AND PREFERRED EMBODIMENTS

The present invention will be described in detail below.

Polymer for Under Layer Film

As the polymer for under layer film, a polymer with a carbon content of preferably 85 wt % or more, and more preferably 90 wt % or more, containing an aromatic hydrocarbon structure in the molecule is preferable.

As the under layer film polmer, the above-described under layer film polymer (1), the polymer with the structural unit of the following formula (4) (hereinafter referred to as "under layer film polymer (4)"), the polymer with the structural unit of the following formula (5) (hereinafter referred to as "under layer film polymer (5)"), and the polymer with the structural unit of the following formula (6)

(hereinafter referred to as "under layer film polymer (6)"), and the like can be given.

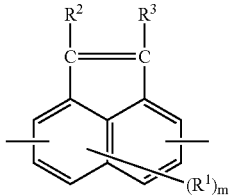

wherein $R^1$, m, $R^2$, and $R^3$ are the same as defined in the above formula (1).

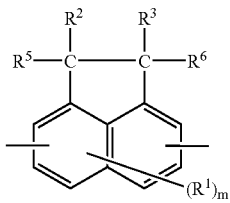

wherein $R^1$, m, $R^2$, and $R^3$ are the same as defined in the above formula (1), and $R^5$ and $R^6$ individually represent a monovalent atom or monovalent group.

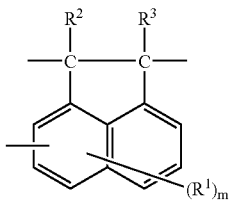

wherein $R^1$, m, $R^2$, and $R^3$ are the same as defined in the above formula (1). Of these, under layer film polymer (1) is preferable.

As examples of the monovalent atom or monovalent group represented by $R^1$ in the formula (1), a halogen atom, hydroxyl group, mercapto group, carboxyl group, nitro group, sulfonic acid group, phenyl group, alkyl group, alkenyl group, amino group, and acyl group, wherein one or more hydrogen atoms on the phenyl group, alkyl group, and alkenyl group may be replaced by one or more, same or different, substituents such as a halogen atom, hydroxyl group, mercapto group, carboxyl group, nitro group, and sulfonic acid group, can be given.

As examples of the halogen atom, a fluorine atom, chlorine atom, bromine atom, and the like can be given.

As the alkyl group, alkyl groups having 1–10 carbon atoms are preferable. Particularly preferable examples are linear or branched alkyl groups having 1–6 carbon atoms, such as a methyl group, ethyl group, n-propyl group, i-propyl group, n-butyl group, i-butyl group, sec-butyl group, and t-butyl group.

As the alkenyl group, alkenyl groups having 2–10 carbon atoms are preferable. Particularly preferable examples are linear or branched alkenyl groups having 2–6 carbon atoms, such as a vinyl group, propenyl group, 1-butenyl group, and 2-butenyl group.

As the amino group, primary amino groups are preferable. Particularly preferable examples are linear or branched primary amino groups having 1–6 carbon atoms, such as an aminomethyl group, 2-aminoethyl group, 3-aminopropyl group, and 4-aminobutyl group.

As the acyl group, acyl groups having 2–10 carbon atoms are preferable. Particularly preferable examples are aliphatic or the aromatic acyl groups having 2–6 carbon atoms, such as an acetyl group, propionyl group, butyryl group, and benzoyl group.

As examples of the monovalent atom or monovalent group represented by $R^2$ or $R^3$ in the formula (1), the same monovalent atoms or monovalent groups as those previously given for the group $R^1$ can be given. The monovalent atom or monovalent group represented by $R^2$ or $R^3$ and the monovalent atom or monovalent group represented by $R^1$ may be either the same or different.

As examples of the monovalent atom or monovalent group represented by $R^5$ or $R^6$ in the formula (5), the same monovalent atoms or monovalent groups as those previously given for the group $R^1$ in the formula (1) can be given. The monovalent atom or monovalent group represented by $R^5$ or $R^6$ in the formula (5), the monovalent atom or monovalent group represented by $R^1$, and the monovalent atom or monovalent group represented by $R^2$ or $R^3$ may be either the same or different.

As a more specific example of the under layer film polymer (1), a polymer having the structural unit of by the following formula (7) (hereinafter referred to as "under layer film polymer (1-1)") can be given. As a more specific example of the under layer film polymer (4), a polymer having the structural unit of by the following formula (8) (hereinafter referred to as "under layer film polymer (4-1)") can be given. As a more specific example of the under layer film polymer (5), a polymer having the structural unit of by the following formula (9) (hereinafter referred to as "under layer film polymer (5-1)") can be given.

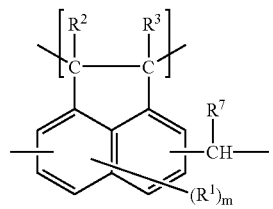

wherein $R^1$, m, $R^2$, and $R^3$ are the same as defined in the above formula (1), and $R^7$ represents a hydrogen atom or a monovalent organic group.

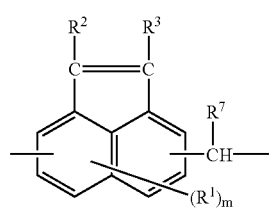

wherein $R^1$, m, $R^2$, and $R^3$ are the same as defined in the above formula (1), $R^5$ and $R^6$ are the same as defined in the above formula (5), and $R^7$ is the same as defined in the above formula (7).

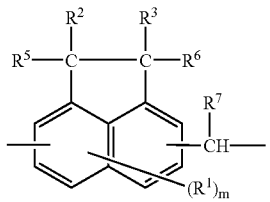

(9)

wherein $R^1$, m, $R^2$, and $R^3$ are the same as defined in the above formula (1) and $R^7$ is the same as defined in the above formula (7).

Alkyl groups, alkenyl groups, alicyclic groups, aromatic hydrocarbon groups, heterocyclic groups, and the like can be given as examples of the monovalent organic group represented by $R^7$ in the formulas (7), (8), and (9).

As the alkyl groups represented by $R^7$, linear or branched alkyl groups having 1–6 carbon atoms, such as a methyl group, ethyl group, n-propyl group, i-propyl group, n-butyl group, i-butyl group, sec-butyl group, and t-butyl group are preferable.

As the alkenyl groups represented by $R^7$, linear or branched alkenyl groups having 2–6 carbon atoms such as a vinyl group, propenyl group, 1-butenyl group, and 2-butenyl group are preferable.

As the alicyclic groups represented by $R^7$, alicyclic groups having 4–10 carbon atoms such as a cyclopentyl group and cyclohexyl group are preferable.

As the aromatic hydrocarbon groups represented by $R^7$, aromatic hydrocarbon groups having 6–12 carbon atoms such as a phenyl group, 1-naphthyl group, and 2-naphthyl group are preferable.

As the heterocyclic groups represented by $R^7$, 4–10 member heterocyclic groups such as a 2-furanyl group, tetrahydro-2-furanyl group, furfuryl group, tetrahydrofurfuryl group, thiofurfuryl group, 2-pyranyl group, tetrahydro-2-pyranyl group, 2-pyranylmethyl group, and tetrahydro-2-pyranylmethyl group are preferable.

The under layer film polymers can be prepared by the following methods. However, the process of preparing the under layer film polymers are not limited to these methods.

Preparation Method (a)

(a-1) A method of condensing an acenaphthylene and an aldehyde, optionally, together with other co-condensable aromatic compounds in the presence of an acid catalyst to obtain a polymer, followed by polymerization of this polymer, either independently or in combination with other copolymerizable monomers; (a-2) a method of polymerizing an acenaphthylene, either independently or in combination with other copolymerizable monomers, and condensing the resulting polymer with an aldehyde, optionally, together with other co-condensable aromatic compounds in the presence of an acid catalyst; or (a-3) a method of polymerizing an acenaphthylene substituted with a group —CH$_2$—OR (wherein R is a hydrogen atom or a monovalent group) independently or, if required, together with other acenaphthylenes and other aromatic compounds, to obtain a polymer having a recurring unit of the following formula (i) (this polymer is hereinafter referred to from time to time as "polymer (i)"), coating the polymer onto a substrate, and condensing with heating to obtain the under layer film polymer (1-1).

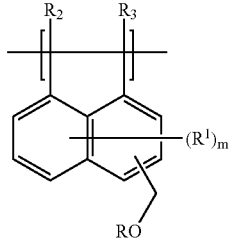

(1)

wherein R is a hydrogen atom or a monovalent group, and $R^1$, m, $R^2$, and $R^3$ are the same as defined in the above formula (1).

Preparation Method (b)

A method of condensing an acenaphthylene and an aldehyde, optionally, together with the other co-condensable aromatic compounds in the presence of an acid catalyst to obtain the under layer film polymer (4-1).

Preparation Method (c)

A method of condensing an acenaphthene and an aldehyde, optionally, together with the other co-condensable aromatic compounds in the presence of an acid catalyst to obtain the under layer film polymer (5-1).

The under layer film polymer (6) can be obtained by the step of polymerizing an acenaphthylene, either independently or in combination with other copolymerizable monomers, in the method of (a-2).

The above method (a-3) is particularly preferable because of excellent storage stability of the composition for preparing the under layer film and ease of adjusting the degree of crosslinking of the under layer film polymer.

The following compounds can be given as acenaphthylenes used in the preparation method (a): acenaphthylene; halogenated acenaphthylenes such as 1-chloroacenaphthylene, 3-chloroacenaphthylene, 4-chloroacenaphthylene, 5-chloroacenaphthylene, 1-bromoacenaphthylene, 3-bromoacenaphthylene, 4-bromoacenaphthylene, and 5-bromoacenaphthylene; hydroxyacenaphthylenes such as 1-hydroxyacenaphthylene, 3-hydroxyacenaphthylene, 4-hydroxyacenaphthylene, and 5-hydroxyacenaphthylene; mercaptoacenaphthylenes such as 1-mercaptoacenaphthylene, 3-mercaptoacenaphthylene, 4-mercaptoacenaphthylene, and 5-mercaptoacenaphthylene; acenaphthylene carboxylic acids such as acenaphthylene-1-carboxylic acid, acenaphthylene-3-carboxylic acid, acenaphthylene-4-carboxylic acid, and acenaphthylene-5-carboxylic acid; nitroacenaphthylenes such as 1-nitroacenaphthylene, 3-nitroacenaphthylene, 4-nitroacenaphthylene, and 5-nitroacenaphthylene; acenaphthylene sulfonic acids such as acenaphthylene-1-sulfonic acid, acenaphthylene-3-sulfonic acid, acenaphthylene-4-sulfonic acid, and acenaphthylene-5-sulfonic acid; alkyl acenaphthylenes such as 1-methylcenaphthylene, 3-methylacenaphthylene, 4-methylacenaphthylene, 5-methylacenaphthylene, 1-ethylacenaphthylene, 3-ethylacenaphthylene, 4-ethylacenaphthylene, and 5-ethylacenaphthylene; alkenyl acenaphthylenes such as 1-vinylacenaphthylene, 3-vinylacenaphthylene, 4-vinylacenaphthylene, and 5-vinylacenaphthylene; aminoacenaphthylenes such as 1-aminoacenaphthylene, 3-aminoacenaphthylene, 4-aminoacenaphthylene, and 5-aminoacenaphthylene; acetylacenaphthylenes such as 1-acetylacenaphthylene, 3-acetylacenaphthylene, 4-acetylacenaphthylene, and 5-acetylacenaphthylene; phenylacenaphthylenes such as 1-phenylacenaphthylene, 3-phenylacenaphthylene, 4-phenylacenaphthylene, and 5-phenylacenaphthylene; and the like.

These acenaphthylenes may be used either individually or in combinations of two or more.

The following compounds can be given as preferable acenaphthylenes substituted with the group —CH$_2$—OR: hydroxymethylacenaphthylenes such as
3-hydroxymethylacenaphthylene,
4-hydroxymethylacenaphthylene,
5-hydroxymethylacenaphthylene,
1-methyl-3-hydroxymethylacenaphthylene,
1-methyl-4-hydroxymethylacenaphthylene,
1-methyl-5-hydroxymethylacenaphthylene,
1-methyl-6-hydroxymethylacenaphthylene,
1-methyl-7-hydroxymethylacenaphthylene,
1-methyl-8-hydroxymethylacenaphthylene,
1,2-dimethyl-3-hydroxymethylacenaphthylene,
1,2-dimethyl-4-hydroxymethylacenaphthylene,
1,2-dimethyl-5-hydroxymethylacenaphthylene,
1-phenyl-3-hydroxymethylacenaphthylene,
1-phenyl-4-hydroxymethylacenaphthylene,
1-phenyl-5-hydroxymethylacenaphthylene,
1-phenyl-6-hydroxymethylacenaphthylene,
1-phenyl-7-hydroxymethylacenaphthylene,
1-phenyl-8-hydroxymethylacenaphthylene,
1,2-diphenyl-3-hydroxymethylacenaphthylene,
1,2-diphenyl-4-hydroxymethylacenaphthylene, and
1,2-diphenyl-5-hydroxymethylacenaphthylene; methoxymethylacenaphthylenes such as
3-methoxymethylacenaphthylene,
4-methoxymethylacenaphthylene,
5-methoxymethylacenaphthylene,
1-methyl-3-methoxymethylacenaphthylene,
1-methyl-4-methoxymethylacenaphthylene,
1-methyl-5-methoxymethylacenaphthylene,
1-methyl-6-methoxymethylacenaphthylene,
1-methyl-7-methoxymethylacenaphthylene,
1-methyl-8-methoxymethylacenaphthylene,
1-dimethyl-3-methoxymethylacenaphthylene,
1,2-dimethyl-4-methoxymethylacenaphthylene,
1,2-dimethyl-5-methoxymethylacenaphthylene,
1-phenyl-3-methoxymethylacenaphthylene,
1-phenyl-4-methoxymethylacenaphthylene,
1-phenyl-5-methoxymethylacenaphthylene,
1-phenyl-6-methoxymethylacenaphthylene,
1-phenyl-7-methoxymethylacenaphthylene,
1-phenyl-8-methoxymethylacenaphthylene,
1,2-diphenyl-3-methoxymethylacenaphthylene,
1,2-diphenyl-4-methoxymethylacenaphthylene, and
1,2-diphenyl-5-methoxymethylacenaphthylene; and the like.

The following compounds can be given as aldehydes used in the preparation method (a): saturated aliphatic aldehydes such as formaldehyde, paraformaldehyde, acetaldehyde, and propylaldehyde; unsaturated aliphatic aldehydes such as acrolein and methacrolein; heterocyclic aldehydes such as furfural; aromatic aldehydes such as benzaldehyde, 1-naphthalaldehyde and 9-anthraldehyde; and the like.

Of these aldehydes, formaldehyde and paraformaldehyde are particularly preferable.

These aldehydes may be used either individually or in combinations of two or more.

The amount of the aldehydes to be used in the preparation method (a) is usually 1–1,000 parts by weight, and preferably 5–500 parts by weight, for 100 parts by weight of acenaphthylenes.

The other co-condensable aromatic compounds that are optionally used in the preparation method (a) are not specifically limited inasmuch as such aromatic compounds can co-condensate with acenaphthylenes.

For example, unsubstituted aromatic hydrocarbons such as benzene, naphthalene, anthracene, phenanthrene, and acenaphthene; alkyl-substituted aromatic hydrocarbons such as toluene, m-xylene, p-xylene, and 1-methylnaphthalene; hydroxy-substituted aromatic hydrocarbons such as phenol, cresol, 1-naphtol, bisphenols, and polyhydric phenols; carboxyl-substituted aromatic hydrocarbons such as aromatic such as benzoic acid, 1-naphthalene carboxylic acid, 9-anthracene carboxylic acid; amino-substituted aromatic hydrocarbons such as aniline, 1-aminonaphthalene, and 9-aminoanthracene; halogen-substituted aromatic hydrocarbons such as chlorobenzene, bromobenzene, 1-chloronaphthalene, and 1-bromonaphthalene; and the like can be given.

These other aromatic compounds may be used either individually or in combination of two or more.

These other aromatic compounds are usually used in the preparation method (a) in the amount of 10,000 parts by weight or less for 100 parts by weight of acenaphthylenes.

The following compounds can be given as other copolymerizable monomers optionally used in the preparation method (a): substituted of unsubstituted styrenes such as styrene, α-methylstyrene, o-methylstyrene, m-methylstyrene, p-methylstyrene, o-hydroxystyrene, m-hydroxystyrene, p-hydroxystyrene, o-acetoxystyrene, m-acetoxystyrene, p-acetoxystyrene, and p-t-butoxystyrene; carboxylic acid vinyl esters such as vinyl acetate, vinyl propionate, and vinyl caprate; cyanated vinyl compounds such as (meth)acrylonitrile and a-chloroacrylonitrile; unsaturated carboxylic acid esters such as methyl (meth)acrylate, ethyl (meth)acrylate, n-propyl (meth)acrylate, n-butyl (meth)acrylate, t-butyl (meth)acrylate, n-hexyl (meth)acrylate, and glycidyl (meth)acrylate; unsaturated group-containing unsaturated carboxylates such as ethylene glycol di(meth)acrylate, propylene glycol di(meth)acrylate, vinyl (meth)acrylate, dimethyl-vinyl methacryloyloxymethylsilane; halogen-containing vinyl compounds such as 2-chloroethyl vinyl ether, vinyl chloroacetate, allyl chloroacetate; hydroxyl group-containing vinyl compounds such as 2-hydroxyethyl (meth)acrylate, 2-hydroxypropyl (meth)acrylate, and (meth)allyl alcohol; amide group-containing vinyl compounds such as (meth) acryl amide and crotonic acid amide; carboxyl group-containing vinyl compounds such as mono-[2-(meth)acryloyloxyethyl] succinate, mono-[2-(meth)acryloyloxyethyl] maleate, and mono-[2-(meth)acryloyloxyethyl] phthalate; vinyl aryl compounds such as 1-vinylnaphthalene, 2-vinylnaphthalene, 9-vinylanthracene, and 9-vinylcarbazole, and the like.

These other copolymerizable monomers may be used either individually or in combination of two or more.

The ratio of the acenaphthylenes to the total amount of the acenaphthylenes and the other copolymerizable monomers used in the method (a) is preferably 5–100 mol %, more preferably 10–100 mol %, and still more preferably 20–100 mol %.

The polymerization in the method (a) may be carried out by radical polymerization, anionic polymerization, or cationic polymerization using an appropriate process such as mass polymerization process, solution polymerization process, or the like.

Mw of the polymer obtained by condensing an acenaphthylene and an aldehyde, optionally, together with the other co-condensable aromatic compounds in the preparation method (a-1) and Mw of the polymer obtained by polymerizing an acenaphthylene, either independently or in combination with other copolymerizable monomers in the preparation method (a-2) can be appropriately selected from the range usually of 100–10,000, and preferably 2,000–5,000, according to the characteristics desired for the under layer film.

As examples of the aldehydes and the other optionally used aromatic compounds, which are used in the preparation method (b), the same the aldehyde compounds and other aromatic compounds as those previously given in connection with the preparation method (a) can be given.

The amount of the aldehydes used in the preparation method (b) is usually 1–1,000 parts by weight, and preferably 5–500 parts by weight, for 100 parts by weight of acenaphthylenes. The other aromatic compounds are usually used in the amount of 10,000 parts by weight or less for 100 parts by weight of acenaphthylenes.

The following compounds can be given as acenaphthenes used in the preparation method (c): acenaphthene; halogenated acenaphthenes such as 1-chloroacenaphthene, 3-chloroacenaphthene, 4-chloroacenaphthene, 5-chloroacenaphthene, 1-bromoacenaphthene, 3-bromoacenaphthene, 4-bromoacenaphthene, and 5-bromoacenaphthene; hydroxyacenaphthenes such as 1-hydroxyacenaphthene, 3-hydroxyacenaphthene, 4-hydroxyacenaphthene, and 5-hydroxyacenaphthene; mercaptoacenaphthenes such as 1-mercaptoacenaphthene, 3-mercaptoacenaphthene, 4-mercaptoacenaphthene, and 5-mercaptoacenaphthene; acenaphthene carboxylatic acids such as acenaphthene-1-carboxylic acid, acenaphthene-3-carboxylic acid, acenaphthene-4-carboxylic acid, and acenaphthene-5-carboxylic acid; nitroacenaphthenes such as 1-nitroacenaphthene, 3-nitroacenaphthene, 4-nitroacenaphthene, and 5-nitroacenaphthene; acenaphthene sulfonic acids such as acenaphthene-1-sulfonic acid, acenaphthene-3-sulfonic acid, acenaphthene-4-sulfonic acid, and acenaphthene-5-sulfonic acid; alkyl acenaphthenes such as 1-methylacenaphthene, 3-methylacenaphthene, 4-methylacenaphthene, 5-methylacenaphthene, 4-ethylacenaphthene, 3-ethylacenaphthene, 4-ethylacenaphthene, and 5-ethylacenaphthene; alkenyl acenaphthenes such as 1-vinylacenaphthene, 3-vinylacenaphthene, 4-vinylacenaphthene, and 5-vinylacenaphthene; aminoacenaphthenes such as 1-aminoacenaphthene, 3-aminoacenaphthene, 4-aminoacenaphthene, and 5-aminoacenaphthene; acetylacenaphthenes such as 1-acetylacenaphthene, 3-acetylacenaphthene, 4-acetylacenaphthene, and 5-acetylacenaphthene; phenylacenaphthenes such as 1-phenylacenaphthene, 3-phenylacenaphthene, 4-phenylacenaphthene, and 5-phenylacenaphthene; and the like.

These acenaphthenes may be used either individually or in combinations of two or more.

As examples of the aldehydes and the other optionally used aromatic compounds, which are used in the preparation method (c), the same the aldehyde compounds and other aromatic compounds as those previously given in connection with the preparation method (a) can be given.

The amount of the aldehydes used in the preparation method (c) is usually 1–1,000 parts by weight, and preferably 5–500 parts by weight, for 100 parts by weight of acenaphthenes.

The other aromatic compounds are usually used in the preparation method (c) in the amount of 10,000 parts by weight or less for 100 parts by weight of acenaphthenes.

The condensation reaction of the preparation methods (a)–(c) is carried out in the presence of an acid catalyst, either using or not using a solvent (preferably using a solvent), by heating the reaction mixture.

As the acid catalyst, mineral acids such as sulfuric acid, phosphoric acid, and perchloric acid; organic sulfonic acids such as p-toluenesulfonic acid, carboxylic acids such as formic acid and oxalic acid, the like can be given.

The amount of the acid catalysts used is appropriately adjusted according to the type of acids used. Such an amount is usually 0.001–10,000 parts by weight, preferably 0.01–1,000 parts by weight, for 100 parts by weight of the acenaphthylenes or acenaphthenes.

The solvents used for the condensation reaction in the preparation methods (a)–(c) are not specifically limited inasmuch as the solvents do not interfere with the condensation reaction. For example, solvents conventionally used for the synthesis of resins in which aldehydes are used as a raw material, such as phenol resins, melamine resins, and amino-type resins, can be used. Specific examples include, in addition to the solvents described below that are used for pattern-forming composition in the present invention, cyclic ethers such as tetrahydrofuran and dioxane, and the like. When the acid catalyst used is liquid such as formic acid, for example, the acid catalyst may also function as a solvent.

The reaction temperature in the condensation reaction in the methods (a)–(c) is usually from 40° C. to 200° C. The reaction time is appropriately adjusted according to the reaction temperature usually in the range from 30 minutes to 72 hours.

Mw of the under layer film polymer of the present invention is usually 500–100,000, and preferably 5,000–50,000.

In the present invention, the under layer film polymers can be used either individually or in combination of two or more.

Composition for Forming Under Layer Film

When forming under layer films using the under layer film polymer in the present invention, a solution in which the under layer film polymer is dissolved in a solvent, optionally together with additives that are described later, is used. Such a solution is hereinafter referred to as "composition for forming under layer films". When forming the under layer film polymer (1-1) using the polymer (i), a solution in which the polymer (i) is dissolved in a solvent, optionally together with additives that are described later, is used as the composition for forming under layer films.

Any solvent capable of dissolving the under layer film polymers and additives can be used without any specific limitation. Examples of the solvents that can be used include: ethylene glycol monoalkyl ethers such as ethylene glycol monomethyl ether, ethylene glycol monoethyl ether, ethylene glycol mono-n-propyl ether, and ethylene glycol mono-n-butyl ether; ethylene glycolmonoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; diethylene glycol dialkyl ethers such as diethylene glycol dimethyl ether, diethylene glycol diethyl ether, diethylene glycol di-n-propyl ether, diethylene glycol di-n-butyl ether; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; lactic acid esters such as methyl lactate, ethyl lactate, n-propyl lactate, i-propyl lactate, n-butyl lactate, and i-butyl lactate; aliphatic carboxylic acid esters such as methyl formate, ethyl formate, n-propyl formate, i-propyl formate, n-butyl formate, i-butyl formate, n-amyl formate, i-amyl formate, methyl acetate, ethyl acetate, n-propyl acetate, i-propyl acetate, n-butyl acetate, i-butyl acetate, n-amyl acetate, i-amyl acetate, n-hexyl acetate, methyl propionate, ethyl propionate, n-propyl propionate, i-propyl propionate, n-butyl propionate, i-butyl propionate, methyl butyrate, ethyl butyrate, n-propyl butyrate, i-propylbutyrate, n-butylbutyrate, and i-butylbutyrate; other esters such as ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, butyl 3-methoxyacetate, butyl 3-methyl-3-methoxyacetate, butyl 3-methyl-3-methoxypropionate, butyl 3-methyl-3-methoxybutyrate, methyl acetoacetate, methyl pyruvate, and ethyl pyruvate; aromatic hydrocarbons such as toluene and xylene; ketones such as methyl ethyl ketone, 2-pentanone, 2-hexanone, 2-heptanone, 3-heptanone, 4-heptanone, and cyclohexanone; amides such as N-methylformamide, N,N-dimethylformamide, N-methylacetamide, N,N-dimethyl acetamide, and N-methylpyrrolidone; and lactones such as γ-butyrolactone; and the like.

Of these solvents, ethylene glycol monoethyl ether acetates, ethyl lactate, methyl 3-methoxypropionate, ethyl 3-ethoxypropionate, 2-heptanone, cyclohexanone, and the like are preferable.

These solvents may be used either individually or in combination of two or more.

The solvent is used in the composition for forming the under layer films in an amount to make the total solid content of the composition usually 0.01–70 wt %, preferably 0.05–60 wt %, and more preferably 0.1–50 wt %.

Additives such as crosslinking agents, polymers other than the under layer film polymers (hereinafter referred to as "other polymers"), radiation absorbers, surfactants, and acid generators maybe optionally added to the composition for forming the under layer films to the extent not impairing the effect of the present invention.

The crosslinking agents exhibit the effects of preventing intermixing between the under layer film obtained by coating the composition for forming the under layer films on the substrate and the pattern forming layer to be formed on the under layer film and also preventing cracking in the coatings made from the composition for forming the under layer film after coating.

Polynuclear phenolic compounds and various commercially available curing agents can be used as such a crosslinking agent.

As examples of polynuclear phenolic compounds, binuclear phenols such as 4,4'-biphenyldiol, 4,4'-methylenebisphenol, 4,4'-ethylidenebisphenol, and bisphenol A; trinuclear phenols such as 4,4',4"-methylidenetrisphenol, 4,4'-[1-{4-(1-[4-hydroxyphenyl]-1-methylethyl) phenyl}ethyli dene]bisphenol; and polyphenols such as novolaks can be given.

Of these polynuclear phenolic compounds, 4,4'-[1-{4-(1-[4-hydroxyphenyl]-1-methylethyl)phenyl}ethyli dene] bisphenol, novolaks, and the like are preferable.

These polynuclear phenolic compounds may be used either individually or in combination of two or more.

As curing agents, diisocyanates such as 2,3-tolylene diisocyanate, 2,4-tolylene diisocyanate, 3,4-tolylene diisocyanate, 3,5-tolylenediisocyanate, 4,4'-diphenylmethane diisocyanate, hexamethylene diisocyanate, and 1,4-cyclohexane diisocyanate; commercially available compounds such as epoxy compounds, such as Epicoat 812, 815, 826, 828, 834, 836, 871, 1001, 1004, 1007, 1009, 1031 (manufactured by Yuka Shell Epoxy Kabushiki Kaisha); Araldite 6600, 6700, 6800, 502, 6071, 6084, 6097, 6099 (manufactured by Ciba Geigy); DER331, 332, 333, 661, 644, 667 (manufactured by Dow Chemical); melamine-type curing agents such as Cymel 300, 301, 303, 350, 370, 771, 325, 327, 703, 712, 701, 272, 202, Mycoat 506, 508 (manufactured by Mitsui Cyanamid); benzoquanamine-type curing agents such as Cymel 1123, 1123-10, 1128, Mycoat 102, 105, 106, 130 (manufactured by Mitsui Cyanamid); glycoluril-type curing agents such as NIKALAC N-2702 (manufactured by SANWA CHEMICAL CO., LTD.); and the like can be given.

Of these curing agents, melamine-type curing agents, glycoluril-type curing agents, and the like are preferable.

These curing agents may be used either individually or in combination of two or more.

In addition, the polynuclear phenolic compounds and curing agents can be used in combination as crosslinking agents.

The amount of crosslinking agents to be added is usually 5,000 parts by weight or less, and preferably 1,000 parts by weight or less, for 100 parts by weight of the total solid content of the composition for forming the under layer films.

As the above other monomers, various thermoplastic resins and thermoset (or heat-curable) resins can be used.

As thermoplastic resins non-conjugated diene polymers such as poly(1,4-pentadiene), poly(1,4-hexadiene), and poly (1,5-hexadiene); α,β-unsaturated ketones such as poly(methyl vinyl ketone), poly(aromatic vinyl ketone) and poly (cyclic vinyl ketone); polymers of α,β-unsaturated carboxylic acids or their derivatives such as (meth) acrylic acid, (meth)acrylic acid salts, (meth)acrylic acid esters, (meth)acrylic acid halides, and the like; polymers of α,β-unsaturated carboxylic acid anhydrides such as poly(meth) acrylic acid anhydride, copolymers of maleic acid anhydride; polymers of unsaturated polybasic carboxylic acid esters such as methylene malonic acid diester and itaconic acid diester; polymers of diolefin carboxylic acid esters such as sorbic acid ester and muconic acid ester; polymers of α,β-unsaturated carboxylic acid thio esters such as (meth) acrylic acid thioester and α-chloro(meth)acrylic acid thioester; polymers of (meth)acrylonitrile or its derivatives such as (meth)acrylonitrile and α-chloroacrylonitrile; polymers of (meth)acrylamide or its derivatives such as (meth) acrylamide and N,N-dimethyl (meth)acrylamide; polymers of styryl metallic compounds; polymers of vinyloxymetallic compounds; polyimines; polyethers such as polyphenylene oxide, poly(1,3-dioxolane), polyoxirane, polytetrahydrofuran, and polytetrahydropyrane; polysulfides; polysulfonamides; polypeptides; polyamides such as Nylon 66, Nylons 1 to 12; polyesters such as aliphatic polyester, aromatic polyester, alicyclic polyester, and polycarbonate; polyureas; polysulfones; polyazines; polyamines; polyaromatic ketones; polyimides; polybenzoimidazoles; polybenzoxazoles; polybenzothiazoles; polyaminotriazoles; polyoxadiazoles; polypyrazoles; polytetrazoles; polyquinoxalines; polytriazines; polybenzoxazinones; polyquinolines; anthrazolines; and the like can be given.

The heat-curable resins are the components becoming insoluble in solvents by curing with heating after application to substrates and preventing intermixing between the under layer film and the pattern forming layer. Such resins can be preferably used as the other polymers.

As examples of such heat-curable resins, heat-curable acrylic resins, phenol resins, urea resins, melamine resins, amino-type resins, aromatic hydrocarbon resins, epoxy resins, alkyd resins, and the like can be given.

These other polymers may be used either individually or in combination of two or more.

The amount of other polymers to be added is usually 20 parts by weight or less, and preferably 10 parts by weight or less, for 100 parts by weight of the under layer film polymers.

As the radiation absorberes, dyes such as oil soluble dyes, disperse dyes, basic dyes, methine-type dyes, pyrazole-type dyes, imidazole-type dye, and hydroxyazo-type dyes; fluorescent brightening agents such as norbixin, stilbene, 4,4'-diaminostilbene derivatives, coumarin derivatives, and pyrazoline derivatives; UV absorbers such as hydroxyazo-type dyes, Tinuvin 234 (manufactured by Ciba Geigy), and Tinuvin 1130 (manufactured by Ciba Geigy); aromatic compounds such as anthracene derivatives and anthraquinone derivatives; and the like can be given.

These radiation absorbers may be used either individually or in combination of two or more.

The amount of radiation absorbers to be added is usually 100 parts by weight or less, and preferably 50 parts by weight or less, for 100 parts by weight of the total solid content of the composition for forming the under layer films.

The surfactants are the components exhibiting the effects of improving applicability, striation, wettability, and developability.

As examples of surfactants, nonionic surfactants such as polyoxyethyiene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, polyethylene glycol distearate; commercially available organosiloxane polymers such as KP341 (manufactured by Shin-Etsu Chemical Co., Ltd.); commercially available (meth)acrylic acid-type (co)polymers such as Polyflow No. 75, No. 95 (manufactured by Kyoeisha Chemical Co., Ltd.), FTOP EF101, EF204, EF303, EF352 (manufactured by TOHKEM PRODUCTS CORPORATION), MEGAFAC F171, F172, F173 (manufactured by Dainippon Ink and Chemicals, Inc.), Florard FC430, FC431, FC135, FC93 (manufactured by Sumitomo 3M Ltd.), Asahi Guard AG710, Surflon S382, SC101, SC102, SC103, SC104, SC105, SC106 (manufactured by Asahi Glass Co., Ltd.); and the like can be given.

These surfactants may be used either individually or in combination of two or more.

The amount of surfactants to be added is usually 15 parts by weight or less, and preferably 10 parts by weight or less, for 100 parts by weight of the total solid content of the composition for forming the under layer films.

As the acid generator, a photoacid generator or a heat acid generator may be used.

As the photoacid generator, the photoacid generators used for forming the composition for pattern forming described below can be used.

As the heat acid generator, 2,4,4,6-tetrabromocyclohexadienone, benzointosylate, 2-nitrobenzyltosylate, alkyl sulfonate, and the like can be given.

These heat acid generators may be used either individually or in combination of two or more. The photoacid generators and heat acid generators may be used in combination.

The amount of acid generators to be added is usually 5,000 parts by weight or less, and preferably 0.1–1,000 parts by weight, for 100 parts by weight of the total solid content of the composition for forming the under layer films.

The addition of the acid generators is particularly preferable for the composition for forming the under layer films containing the polymer (1-i) to accelerate the condensation reaction after the application of the composition.

In addition to the above additives, preservatives, antifoaming agents, adhesion adjuvants, and the like may be added to the composition for forming under layer films.

The composition for forming under layer films is usually filtered through a filter with about 0.1 μm pore size before using for the formation of under layer films.

Acid-dissociable Group-containing Polysiloxane

There are no specific restrictions to the acid-dissociable group-containing polysiloxane used in the present invention inasmuch as the polysiloxane is insoluble or scarcely soluble in alkali, but becomes alkali-soluble when the acid-dissociable group dissociates. Particularly preferable polysiloxane contains the structural unit of the following formula (2) (hereinafter referred to as "structural unit (2)") and/or the structural unit of the following formula (3) (hereinafter referred to as "structural unit (3)"),

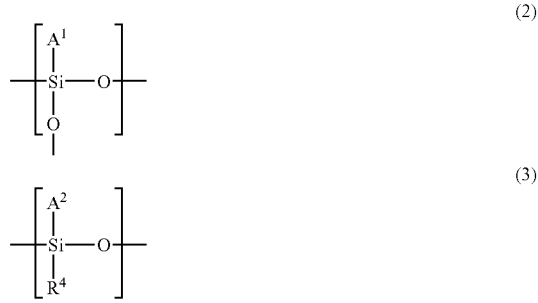

wherein $A^1$ and $A^2$ individually represent a monovalent organic group having an acid-dissociable group which dissociates by an action of an acid and $R^4$ represents a linear, branched, or cyclic alkyl group having 1–10 carbon atoms or a linear, branched, or cyclic haloalkyl group having 1–10 carbon atoms. These polysiloxanes are hereinafter referred to as "polysiloxanes (I)".

As the monovalent organic group having an acid-dissociable group dissociable by the action of an acid, represented by $A^1$ in the formula (2) or A2 or in the formula (3), the groups which dissociate in the presence of an acid to produce preferably a carboxyl group, phenolic hydroxyl group, or alcoholic hydroxyl group, and are stable under the reaction conditions for preparing the polysiloxane (I) of a linear or branched $C_{1-20}$ hydrocarbon group having one or more acid-dissociable groups or a monovalent cyclic $C_{4-30}$ hydrocarbon group having one or more acid-dissociable groups can be given.

The groups of the following formula (10) are preferable as the acid-dissociable groups.

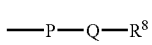  (10)

wherein P indicates a single bond, methylene group, difluoromethylene group, substituted or unsubstituted, linear or branched alkylene group having 2–20 carbon atoms, substituted or unsubstituted, divalent aromatic group having 6–20 carbon atoms, or substituted or unsubstituted, divalent alicyclic group having 3–20 carbon atoms, Q represents a group —COO— or —O—, and $R^8$ represents a monovalent organic group dissociable by the action of an acid to produce hydrogen atoms.

As examples of the linear or branched alkylene groups having 2–20 carbon atoms represented by P in the formula (10), ethylene group, propylene group, trimethylene group, tetramethylene group, and the like can be given; as divalent aromatic groups having 6–20 carbon atoms, phenylene group, naphthylene group, and the like can be given; and as divalent alicyclic groups having 3–20 carbon atoms, cycloalkylene groups such as cyclopropylene group, cyclobutylene group, cyclohexylene group, and the like and divalent hydrocarbon groups having a bridged alicyclic skeleton such as a norbornane skeleton, tricyclodecane skeleton, tetracyclodecane skeleton, adamantane skeleton, and the like can be given.

As substituents on these alkylene groups, divalent aromatic groups, or divalent alicyclic groups, a fluorine atom and a linear or branched fluoroalkyl group having 1–10 carbon atoms are preferable.

These divalent aromatic groups or divalent alicyclic groups may also contain a methylene group, difluoromethylene group, linear or branched alkylene group having 1–10 carbon atoms, or linear or branched fluoroalkylene group having 1–10 carbon atoms.

As the group P in the formula (10), a single bond, methylene group, difluoromethylene group, divalent hydrocarbon group having a tricyclodecane skeleton, its fluoride derivative, divalent hydrocarbon group having an adamantane skeleton, its fluoride derivative, divalent hydrocarbon group having a norbornane skeleton, its fluoride derivative, and the like are preferable. Of these, the divalent hydrocarbon group having a norbornane skeleton and its fluoride derivative are preferable.

As examples of the monovalent organic group dissociable by the action of an acid to produce hydrogen atoms represented by $R^8$, linear, branched, or cyclic alkyl groups such as a methyl group, ethyl group, n-propyl group, i-propyl group, n-butyl group, i-butyl group, sec-butyl group, t-butyl group, cyclopentyl group, 1-methylcyclopentyl group, 1-ethylcyclopentyl group, cyclohexyl group, 1-methylcyclohexyl group, 1-ethylcyclohexyl group, 4-t-butylcyclohexyl group, cycloheptyl group, and cyclooctyl group; alkyl substituted adamantyl groups such as a 1-methyladamantyl group and 1-ethyladamantylmethyl group; aralkyl groups such as a benzyl group, 4-t-butylbenzyl group, phenethyl group, and 4-t-butylphenethyl group; organocarbonyl groups such as a t-butoxycarbonyl group, methoxycarbonyl group, ethoxycarbonyl group, i-propoxycarbonyl group, 2-(trimethylsilyl) ethylcarbonyl group, i-butylcarbonyl group, vinylcarbonyl group, allylcarbonyl group, benzylcarbonyl group, and 4-ethoxy-1-naphthylcarbonyl group; organic groups combining with the oxygen atom in the formula (10) to form an acetal structure such as a methoxymethyl group, methylthiomethyl group, ethoxymethyl group, t-butoxymethyl group, (phenyldimethylsilyl)methoxymethyl group, benzyloxymethyl group, t-butoxymethyl group, siloxymethyl group, 2-methoxyethoxymethyl group, 2,2,2-trichloroethoxymethyl group, bis(2-chloroethoxy)methyl group, 1-methoxycyclohexyl group, tetrahydropyranyl group, 4-methoxytetrahydropyranyl group, tetrahydrofuranyl group, 1-methoxyethyl group, 1-ethoxyethyl group, 1-(2-chloroethoxy)ethyl group, 1-methyl-1-methoxyethyl group, 1-methyl-1-benzyloxyethyl group, 1-(2-chloroethoxy)ethyl group, and 1-methyl-1-benzyloxy-2-fluoroethyl group; silyl groups such as a trimethylsilyl group, triethylsilyl group, dimethylethylsilyl group, t-butyldimethylsilyl group, t-butyldiphenylsilyl group, triphenylsilyl group, diphenylmethylsilyl group, and t-butylmethoxyphenylsilyl group; and the like can be given.

Of these monovalent organic groups dissociating by the action of an acid to produce a hydrogen atom, the t-butyl group, tetrahydropyranyl group, tetrahydrofuranyl group, methoxymethyl group, ethoxymethyl group, 1-methoxyethyl group, 1-ethoxyethyl group, t-butyldimethylsilyl group, and the like are preferable.

As examples of the linear, branched, or cyclic alkyl group having 1–10 carbon atoms represented by $R^4$ in the formula (3), a methyl group, ethyl group, n-propyl group, i-propyl group, cyclopentyl group, and cyclohexyl group can be given. As examples of the linear, branched, or cyclic haloalkyl group having 1–10 carbon atoms, trifluoromethyl group, pentafluoroethyl group, heptafluoro-n-propyl group, heptafluoro-i-propyl group, and perfluorocyclohexyl group can be given.

As $R^4$ in the formula (3), a methyl group, ethyl group, trifluoromethyl group, pentafluoroethyl group, and the like are preferable.

The polysiloxane (I) may also contain one or more structural units having no acid-dissociable groups.

As such other structural units, the structural unit of the following formula (11) (hereinafter referred to as "structural unit (11)"), the structural unit of the following formula (12) (hereinafter referred to as "structural unit (12)"), and the like can be given.

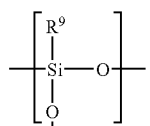  (11)

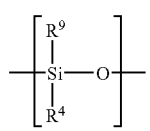  (12)

wherein $R^9$ individually represents a monovalent group of the formula —P—H, —P—F, or —P-Q-H, wherein P is individually the same as defined in the formula (10) and Q is the same as defined in the formula (10), and $R^4$ is the same as defined in the formula (3).

As preferable specific examples of the monovalent group represented by $R^9$ in the formulas (11) and (12), the groups of by the following formulas (13) to (18), a methyl group, ethyl group, norbornyl group, tetracyclodecanyl group, and the like can be given.

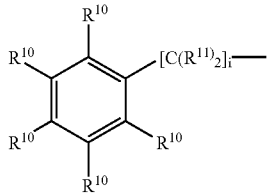
(13)

wherein $R^{10}$ individually represents a fluorine atom, fluoroalkyl group having 1–10 carbon atoms, hydrogen atom, halogen atom other than fluorine atom, alkyl group having 1–10 carbon atoms, or monovalent organic group having an acid-dissociable group dissociable by the action of an acid, $R^{11}$ individually represents a fluorine atom, fluoroalkyl group having 1–10 carbon atoms, hydrogen atom, halogen atom other than fluorine atom, or alkyl group having 1–10 carbon atoms, provided that at least one of five $R^{10}$ groups and 2i $R^{11}$ groups represents a fluorine atom or fluoroalkyl group having 1–10 carbon atoms, and i is an integer of 0 to 10.

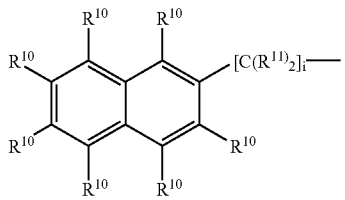
(14)

wherein $R^{10}$ individually represents a fluorine atom, fluoroalkyl group having 1–10 carbon atoms, hydrogen atom, halogen atom other than fluorine atom, alkyl group having 1–10 carbon atoms, or monovalent organic group having an acid-dissociable group dissociable by the action of an acid, $R^{11}$ individually represents a fluorine atom, fluoroalkyl group having 1–10 carbon atoms, hydrogen atom, halogen atom other than fluorine atom, or alkyl group having 1–10 carbon atoms, provided that at least one of seven $R^{10}$ groups and 2i $R^{11}$ groups represents a fluorine atom or fluoroalkyl group having 1–10 carbon atoms, and i is an integer of 0 to 10.

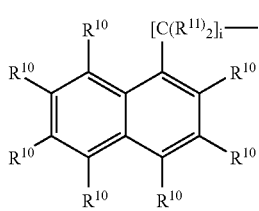
(15)

wherein $R^{10}$ individually represents a fluorine atom, fluoroalkyl group having 1–10 carbon atoms, hydrogen atom, halogen atom other than fluorine atom, alkyl group having 1–10 carbon atoms, or monovalent organic group having an acid-dissociable group dissociable by the action of an acid, $R^{11}$ individually represents a fluorine atom, fluoroalkyl group having 1–10 carbon atoms, hydrogen atom, halogen atom other than fluorine atom, or alkyl group having 1–10 carbon atoms, provided that at least one of seven $R^{10}$ groups and 2i $R^{11}$ groups represents a fluorine atom or fluoroalkyl group having 1–10 carbon atoms, and i is an integer of 0 to 10.

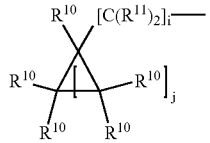
(16)

wherein $R^{10}$ individually represents a fluorine atom, fluoroalkyl group having 1–10 carbon atoms, hydrogen atom, halogen atom other than fluorine atom, alkyl group having 1–10 carbon atoms, or monovalent organic group having an acid-dissociable group dissociable by the action of an acid, $R^{11}$ individually represents a fluorine atom, fluoroalkyl group having 1–10 carbon atoms, hydrogen atom, halogen atom other than fluorine atom, or alkyl group having 1–10 carbon atoms, provided that at least one of (3+2j) $R^{10}$ groups and 2i $R^{11}$ groups represents a fluorine atom or fluoroalkyl group having 1–10 carbon atoms, i is an integer of 0 to 10, and j is an integer of 1 to 18.

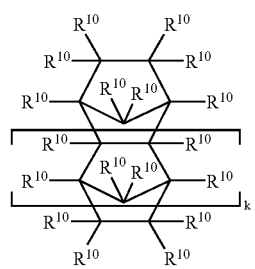
(17)

wherein one of $(12+6k)R^{10}$ groups represents a group $-[C(R^{11})_2]_i-$ and the other $R^{10}$ groups individually represent a fluorine atom, fluoroalkyl group having 1–10 carbon atoms, hydrogen atom, halogen atom other than fluorine atom, alkyl group having 1–10 carbon atoms, or monovalent organic group having an acid-dissociable group dissociable by the action of an acid, wherein $R^{11}$ individually represents a fluorine atom, fluoroalkyl group having 1–10 carbon atoms, hydrogen atom, halogen atom other than fluorine atom, or alkyl group having 1–10 carbon atoms, at least one of the other $R^{10}$ groups among $(11+6k)$ $R^{10}$ groups and 2i $R^{11}$ groups is a fluorine atom or fluoroalkyl group having 1–10 carbon atoms, i is an integer of 0 to 10, and k is an integer of 0 to 3.

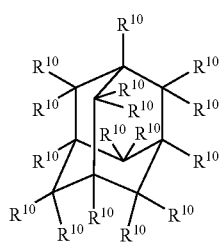
(18)

wherein one of 16 $R^{10}$ groups represents a group $-[C(R^{11})_2]_1-$ and the other $R^{10}$ groups individually represents a fluorine atom, fluoroalkyl group having 1–10 carbon atoms, hydrogen atom, halogen atom other than fluorine atom, alkyl group having 1–10 carbon atoms, or monovalent organic group having an acid-dissociable group dissociable by the action of an acid, $R^{11}$ individually represents a fluorine atom, fluoroalkyl group having 1–10 carbon atoms, hydrogen atom, halogen atom other than the fluorine atom, or alkyl group having 1–10 carbon atoms, provided that at least one of the other 15 $R^{10}$ groups and 2i $R^{11}$ groups is a fluorine atom or fluoroalkyl group having 1–10 carbon atoms.

The polysiloxane (I) can be prepared by a process comprising a polycondensation step of at least one silane compound selected from the compounds of the following formula (19) (hereinafter referred to as "silane compound (19)"), a linear or cyclic oligomer produced by partial condensation of the silane compound (19), the compounds of the following formula (20) (hereinafter referred to as "silane compound (20)"), a linear or cyclic oligomer produced by partial condensation of the silane compound (20), in the presence of an acid catalyst or a base catalyst, preferably in the presence of an acid catalyst.

wherein $A^1$ is the same as defined in the formula (2), $A^2$ and $R^4$ are respectively the same as defined in the formula (3), and $R^{12}$ individually represents a monovalent saturated hydrocarbon group having 1–10 carbon atoms.

As $R^{12}$, in the formulas (19) and (20), an alkyl group having 1–10 carbon atoms is preferable, with a methyl group and ethyl group being particularly preferable.

Here, the "linear or cyclic oligomer prepared by partial condensation of the silane compound (19)" indicates an oligomer of usually 2–10 molecules, preferably 2–5 molecules, in the case of the linear oligomer, and usually 3–10 molecules, preferably 3–5 molecules, in the case of the cyclic oligomer, each oligomer being formed by the condensation of two $R^{12}O$—Si groups in the silane compound (19). The "linear or cyclic oligomer prepared by partial condensation of the silane compound (20)" indicates an oligomer of usually 2–10 molecules, preferably 2–5 molecules, in the case of the linear oligomer, and usually 3–10 molecules, preferably 3–5 molecules, in the case of the cyclic oligomer, each oligomer being formed by the condensation of two $R^{12}O$—Si groups in the silane compound (20).

The silane compounds (19) and (20) may be used either individually or in combination of two or more.

In the present invention, one or more other silane compounds may be used together with these silane compounds (19) and (20) or their partial condensates.

As examples of the other silane compounds, a silane compound of the following formula (21) (hereinafter referred to as "silane compound (21)"), a silane compound of the following formula (22) (hereinafter referred to as "silane compound (22)"), and partial condensates (which indicates a linear oligomer formed from 2–10, preferably 2–5, silane molecules, or acyclic oligomer formed from 3–10, preferably 3–5, silane molecules) of these silane compounds can be given.

wherein $R^4$ is the same as defined in the formula (3), $R^9$ is the same as defined in the formulas (11) and (12), and $R^{12}$ is the same as defined in the formulas (19) and (20).

As $R^{12}$, in the formulas (21) and (22), an alkyl group having 1–10 carbon atoms is preferable, with a methyl group and ethyl group being particularly preferable.

In the present invention, if at least one compound selected from the group consisting of the silane compound (21), silane compound (22), and their partial condensates, preferably the silane compound (21) and its partial condensate, is condensed together with the silane compound (19), silane compound (20), or their partial condensates, the molecular weight and glass transition temperature (Tg) of the resulting polysiloxane (I) can be adequately controlled so that transparency at the wavelength of 193 nm or less, particularly at the wavelength of 193 nm or 157 nm, can be further improved.

The total amount of the silane compound (21), silane compound (22), and their partial condensates is usually 1 mol % or more, preferably 5–95 mol %, and particularly preferably 10–90 mol %, for 100 wt % of all silane compounds. If this total amount is less than 1 mol %, transparency to light, particularly to light with a wavelength of 193 nm or 157 nm, tends to be impaired.

As examples of the inorganic acids among the acidic catalysts used for the preparation of polysiloxane (I), hydrochloric acid, sulfuric acid, nitric acid, boric acid, phosphoric acid, titanium tetrachloride, zinc chloride, and aluminum chloride can be given. As examples of organic acids, formic acid, acetic acid, n-propionic acid, butyric acid, valeric acid, oxalic acid, malonic acid, succinic acid, maleic acid, fumaric acid, adipic acid, phthalic acid, terephthalic acid, acetic anhydride, maleic anhydride, citric acid, benzenesulfonic acid, p-toluenesulfonic acid, and methanesulfonic acid can be given.

Of these acidic catalysts, hydrochloric acid, sulfuric acid, acetic acid, oxalic acid, malonic acid, maleic acid, fumaric acid, acetic anhydride, and maleic anhydride are particularly preferable.

These acidic catalysts may be used either individually or in combination of two or more.

The acidic catalysts are usually used in the amount of 0.01–10,000 parts by weight, preferably 0.1–100 parts by weight, for 100 parts by weight of the silane compound.

As examples of inorganic bases among the basic catalysts used for the preparation of the polysiloxane (I), lithium hydroxide, sodium hydroxide, potassium hydroxide, calcium hydroxide, barium hydroxide, sodium hydrogencarbonate, potassium hydrogencarbonate, sodium carbonate, and potassium carbonate can be given.

The following compounds can be given as examples of the organic bases: linear, branched, or cyclic monoalkylamines such as n-hexylamine, n-heptylamine, n-octylamine, n-nonylamine, n-decylamine, and cyclohexylamine; linear, branched, or cyclic dialkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; linear, branched, or cyclic trialkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, dicyclohexylmethylamine, and tricyclohexylamine; aromatic amines such as aniline, N-methylaniline, N,N-dimethylaniline, 2-methylaniline, 3-methylaniline, 4-methylaniline, 4-nitroaniline, diphenylamine, triphenylamine, and naphthylamine; aromatic diamines such as ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, and 1,3-bis[1-(4-aminophenyl)-1-methylethyl]benzene; imidazoles such as imidazole, benzimidazole, 4-methylimidazole, and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine and 1-(2-hydroxyethyl)piperazine; as well as other nitrogen-containing heterocyclic compounds such as pyrazine, pyrazole, pyridazine, quinoxaline, purine, pyrrolidine, piperidine, morpholine, 4-methylmorpholine, 1,4-dimethylpiperazine, and 1,4-diazabicyclo[2.2.2]octane; and the like.

Of these basic catalysts, triethylamine, tri-n-propylamine, tri-n-butylamine, pyridine, and the like are preferable.

These basic catalysts may be used either individually or in combination of two or more.

The basic catalysts are usually used in the amount of 0.01–10,000 parts by weight, preferably 0.1–1,000 parts by weight, for 100 parts by weight of the silane compound.

In the polycondensation reaction for the preparation of the polysiloxane (I), it is preferable that the silane compounds be first polycondensed in the presence of an acidic catalyst, and then a basic catalyst be added to promote the reaction. This mode of reaction ensures occurrence of a crosslinking reaction even if a silane compound possessing an acid-dissociable group that is unstable under the acidic conditions is used, whereby excellent polysiloxane (I) having a high molecular weight and a high glass transition temperature (Tg) can be obtained. In addition, it is possible to control the degree of crosslinking by adjusting the reaction conditions under basic conditions, whereby solubility of the resulting polysiloxane (I) in a developing solution can be controlled.

The polycondensation reaction under acidic conditions or basic conditions is preferably carried out in an inert gas atmosphere such as nitrogen or argon to obtain a pattern-forming layer less susceptible to a negative-tone reaction when forming a resist pattern.

The polycondensation reaction can be carried out either in the presence or in the absence of a solvent.

As the solvent which can be used, the following solvents can be given: linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; alcohols such as n-propylalcohol, i-propylalcohol, n-butylalcohol, t-butylalcohol, cyclohexanol, ethylene glycol monomethyl ether, ethylene glycol monoethyl ether, ethylene glycol mono-n-propyl ether, ethylene glycol mono-n-butyl ether, propylene glycol monomethyl ether, propylene glycol monoethyl ether, and propylene glycol mono-n-propyl ether; dialkylene glycol dialkyl ethers such as diethylene glycol dimethyl ether, diethylene glycol diethyl ether, diethylene glycol di-n-propyl ether, diethylene glycol di-n-butyl ether; ethylene glycol monoalkyl ether acetates such as ethylene glycol monomethyl ether acetate, ethylene glycol monoethyl ether acetate, and ethylene glycol mono-n-propyl ether acetate; aromatic hydrocarbons such as toluene and xylene; other esters such as ethyl 2-hydroxy-2-methylpropionate, ethyl ethoxyacetate, ethyl hydroxyacetate, methyl 2-hydroxy-3-methylbutyrate, butyl 3-methoxyacetate, butyl 3-methyl-3-methoxyacetate, butyl 3-methyl-3-methoxypropionate, butyl 3-methyl-3-methoxybutyrate, ethyl acetate, n-propyl acetate, n-butyl acetate, methyl acetoacetate, ethyl acetoacetate, methyl pyruvate, ethyl pyruvate; N-methylpyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate; and the like.

These solvents may be used either individually or in combination of two or more.

These solvents are usually used in the amount of 2,000 parts by weight or less for 100 parts by weight of all of the silane compounds.

In addition, water may be added to the reaction mixture of the polycondensation reaction. The amount of water to be added is usually 10,000 parts by weight or less for 100 parts by weight of all of the silane compounds.

Furthermore, hexamethyldisiloxane may be added to the reaction mixture of the polycondensation reaction to control the molecular weight of the resulting polysiloxane (I) and to increase stability.

The amount of hexamethyldisiloxane to be added is usually 500 parts by weight or less, and preferably 50 parts by weight or less, for 100 parts by weight of all of the silane compounds. If the amount of hexamethyldisiloxane exceeds 500 parts by weight, the resulting polymer tends to have a smaller molecular weight and a lower glass transition temperature (Tg).

The polycondensation reaction is carried out at a temperature of usually −50 to 300° C., and preferably 20 to 100° C., usually for a period of one minute to 100 hours.

In the polysiloxane (I), the total of the structural units (2) and (3) is usually 1–99 mol %, preferably 1–95 mol %, and more preferably 5–80 mol %, and particularly preferably 10–60 mol % of the total amount of the structural units. If the amount of the above recurring units is less than 1 mol %, resolution during pattern formation tends to decrease. If the amount exceeds 99 mol %, on the other hand, adhesiveness with the under layer film tends to decrease.

The amount of the structural unit (2) is preferably 1–95 mol %, more preferably 5–80 mol %, and particularly preferably 10–60 mol % of the total amount of the structural units. If the amount of the structural unit (2) is less than 1 mol %, resolution during pattern formation may decrease. If the amount exceeds 95 mol %, transparency of the polymer to radiation tends to decrease.

The amount of the structural unit (3) is preferably 95 mol % or less, more preferably 80 mol % or less, and particularly preferably 30 mol % or less of the total amount of the structural units. If the amount of the structural unit (3) is more than 95 mol %, the glass transition temperature (Tg) and transparency to radiation of the resulting polymer tend to decrease.

The total of the structural units (11) and (12) that are optionally incorporated in the polysiloxane (I) is preferably 5–95 mol %, more preferably 20–95 mol %, and particularly preferably 40–90 mol % of the total amount of the structural units. If the amount of these structural units is less than 5 mol %, transparency to radiation of the resulting polymer may decrease. If the amount exceeds 95 mol %, resolution during pattern formation may be impaired.

Usually, polysiloxane (I) has a ladder structure as part of the molecular structure. The ladder structure is principally introduced by the structural unit (2) or the structural unit (11).

Mw of the acid-dissociable group-containing polysiloxane is usually 500–100,000, preferably 500–50,000, and particularly preferably 1,000–10,000. If the Mw of the acid-dissociable group-containing polysiloxane is less than 500, the glass transition temperature (Tg) of the resulting polymer tends to decrease. If the Mw exceeds 100,000, solubility of the polymer in solvents tends to decrease.

Mw/Mn of the acid-dissociable group-containing polysiloxane is 2.5 or less, preferably 2 or less, and more preferable 1.8 or less.

The glass transition temperature (Tg) of the acid-dissociable group-containing polysiloxane is usually 0–500° C., and preferably 50–250° C. If the glass transition temperature (Tg) of the acid-dissociable group-containing polysiloxane is less than 0° C., pattern formation maybe difficult. If more than 500° C., solubility of the polymer in solvents tends to decrease.

In the present invention, the acid-dissociable group-containing polysiloxanes can be used either individually or in combination of two or more.

Bilayer Film

In forming patterns in the present invention, a film of a radiation-sensitive resin composition containing an acid-dissociable group-containing polysiloxane (hereinafter referred to as "pattern-forming composition") is formed on a film containing the under-layer film polymer to obtain a bilayer film. The patterns are then formed using this bilayer film.

Pattern-forming Composition

As the pattern-forming composition in the present invention, a composition containing an acid-dissociable group-containing polysiloxane, a radiation-sensitive acid generator (hereinafter referred to simply as "acid generator"), and, optionally, the later-described additives is used. The pattern-forming composition is usually prepared as a solution in which the pattern-forming composition is dissolved in a solvent (such a solution is hereinafter referred to as "pattern-forming composition solution").

The acid generator is a component generating an acid by being irradiated with light (hereinafter referred to as "exposure to radiation"). The acid causes an acid-dissociable group in the acid-dissociable group-containing polysiloxane to dissociate. As a result, an exposed area of the film formed from the pattern-forming composition (hereinafter referred to as "resist film") becomes readily soluble in an alkaline developer and forms positive-tone resist patterns.

As examples of the acid generator, onium salts, halogen-containing compounds, diazoketone compounds, sulfone compounds, sulfonate compounds, and the like can be given.

These acid generators will now be explained.

Onium Salts

As examples of onium salts, iodonium salts, sulfonium salts (including tetrahydrothiophenium salts), phosphonium salts, diazonium salts, and pyridinium salts can be given.

Specific examples of preferable onium salts include: diphenyliodonium trifluoromethanesulfonate, diphenyliodonium nonafluoro-n-butanesulfonate, diphenyliodonium heptadecafluoro-n-octanesulfonate, diphenyliodonium pyrenesulfonate, diphenyliodonium n-dodecylbenzenesulfonate, diphenyliodonium hexafluoroantimonate, bis(4-t-butylphenyl)iodonium trifluoromethanesulfonate, bis(4-t-butylphenyl)iodonium nonafluoro-n-butanesulfonate, bis(4-t-butylphenyl)iodonium heptadecafluoro-n-octanesulfonate, bis(4-t-butylphenyl)iodonium n-dodecylbenzenesulfonate, bis(4-t-butylphenyl)iodonium hexafluoroantimonate, bis(4-t-butylphenyl)iodonium naphthalenesulfonate, triphenylsulfonium trifluoromethanesulfonate, triphenylsulfonium nonafluoro-n-butanesulfonate, triphenylsulfonium heptadecafluoro-n-octanesulfonate, triphenylsulfonium hexafluoroantimonate, triphenylsulfonium naphthalenesulfonate, triphenylsulfonium 10-camphorsulfonate, 4-hydroxyphenyl.phenyl.methylsulfonium p-toluenesulfonate, cyclohexyl.2-oxocyclohexyl.methylsulfonium trifluoromethanesulfonate, cyclohexyl.2-oxocyclohexyl.methylsulfonium nonafluoro-n-butanesulfonate, cyclohexyl.2-oxocyclohexyl.methylsulfonium heptadecafluoro-n-octanesulfonate, dicyclohexyl.2-oxocyclohexylsulfonium trifluoromethanesulfonate, dicyclohexyl.2-oxocyclohexyl-sulfonium nonafluoro-n-butanesulfonate, dicyclohexyl.2-oxocyclohexylsulfonium heptadecafluoro-n-octanesulfonate, 2-oxocyclohexyldimethylsulfonium trifluoromethanesulfonate, 2-oxocyclohexyldimethylsulfonium nonafluoro-n-butanesulfonate, 2-oxocyclohexyldimethyisulfonium heptadecafluoro-n-octanesulfonate, 4-hydroxyphenyl.benzyl.methylsulfonium p-toluenesulfonate, 1-naphthyldimethylsulfonium trifluoromethanesulfonate, 1-naphthyldimethylsulfonium nonafluoro-n-butanesulfonate, 1-naphthyldimethylsulfonium heptadecafluoro-n-octanesulfonate, 1-naphthyldiethylsulfonium trifluoromethanesulfonate, 1-naphthyldiethylsulfonium nonafluoro-n-butanesulfonate, 1-naphthyldiethylsulfonium heptadecafluoro-n-octanesulfonate, 4-cyano-1-naphthyldimethylsulfonium trifluoromethanesulfonate, 4-cyano-1-naphthyldimethylsulfonium nonafluoro-n-butanesulfonate, 4-cyano-1-naphthyldimethylsulfonium heptadecafluoro-n-octanesulfonate, 4-cyano-1-naphthyldiethylsulfonium trifluoromethanesulfonate, 4-cyano-1-naphthyldiethylsulfonium nonafluoro-n-butanesulfonate, 4-cyano-1-naphthyldiethylsulfonium heptadecafluoro-n-octanesulfonate, 4-nitro-1-naphthyldimethylsulfonium trifluoromethanesulfonate, 4-nitro-1-naphthyldimethylsulfonium nonafluoro-n-butanesulfonate, 4-nitro-1-naphthyldimethylsulfonium heptadecafluoro-n-octanesulfonate, 4-nitro-1-naphthyldiethylsulfonium trifluoromethanesulfonate, 4-nitro-1-naphthyldiethylsulfonium nonafluoro-n-butanesulfonate, 4-nitro-1-naphthyldiethylsulfonium heptadecafluoro-n-octanesulfonate, 4-methyl-1-naphthyldimethylsulfonium trifluoromethanesulfonate, 4-methyl-1-naphthyldimethylsulfonium nonafluoro-n-butanesulfonate, 4-methyl-1-naphthyldimethylsulfonium heptadecafluoro-n-octanesulfonate, 4-methyl-1-naphthyldiethylsulfonium trifluoromethanesulfonate, 4-methyl-1-naphthyldiethylsulfonium nonafluoro-n-butanesulfonate, 4-methyl-1-naphthyldiethylsulfonium heptadecafluoro-n-octanesulfonate, 4-hydroxy-1-naphthyldimethylsulfonium trifluoromethanesulfonate, 4-hydroxy-1-naphthyldimethylsulfonium nonafluoro-n-butanesulfonate, 4-hydroxy-1-naphthyldimethylsulfonium heptadecafluoro-n-octanesulfonate, 4-hydroxy-1-naphthyldiethylsulfonium trifluoromethanesulfonate, 4-hydroxy-1-naphthyldiethylsulfonium nonafluoro-n-butanesulfonate, 4-hydroxy-1-naphthyldiethylsulfonium heptadecafluoro-n-octanesulfonate, 4-hydroxy-1-naphthyltetrahydrothiophenium trifluoromethanesulfonate, 4-methoxy-1-naphthyltetrahydrothiophenium trifluoromethanesulfonate, 4-ethoxy-1-naphthyltetrahydrothiophenium trifluoromethanesulfonate, 4-methoxymethoxy-1-napthyltetrahydrothiophenium trifluoromethanesulfonate, 4-ethoxymethoxy-1-napthyltetrahydrothiophenium trifluoromethanesulfonate, 4-(1-methoxyethoxy)-1-naphthyltetrahydrothiophenium trifluoromethanesulfonate, 4-(2-methoxyethoxy)-1-naphthyltetrahydrothiophenium trifluoromethanesulfonate, 4-methoxycarbonyloxy-1-naphthyltetrahydrothiophenium trifluoromethanesulfonate, 4-ethoxycarbonyloxy-1-naphthyltetrahydrothiophenium trifluoromethanesulfonate, 4-n-propoxycarbonyloxy-1-naphthyltetrahydrothiophenium trifluoromethanesulfonate, 4-i-propoxycarbonyloxy-1-naphthyltetrahydrothiophenium trifluoromethanesulfonate, 4-n-butoxycarbonyloxy-1-naphthyltetrahydrothiophenium trifluoromethanesulfonate, 4-t-butoxycarbonyloxy-1-naphthyltetrahydrothiophenium trifluoromethanesulfonate, 4-(2-tetrahydrofuranyloxy)-1-naphthyltetrahydrothiophenium trifluoromethanesulfonate, 4-(2-tetrahydropyranyloxy)-1-naphthyltetrahydrothiophenium trifluoromethanesulfonate, 4-benzyloxy-1-naphthyltetrahydrothiophenium trifluoromethanesulfonate, 1-(1-naphthylacetomethyl)tetrahydrothiophenium trifluoromethanesulfonate, 4-n-butoxy-1-naphthyltetrahydrothiophenium nonafluoro-n-butanesulfonate, and the like can be given.

Halogen-containing Compounds

As examples of halogen-containing compounds, haloalkyl group-containing hydrocarbon compounds, haloalkyl group-containing heterocyclic compounds, and the like can be given.

As specific examples of preferable halogen-containing compounds, (trichloromethyl)-s-triazine derivatives such as phenylbis(trichloromethyl)-s-triazine, 4-methoxyphenylbis(trichloromethyl)-s-triazine, and 1-naphthylbis(trichloromethyl)-s-triazine, 1,1-bis(4-chlorophenyl)-2,2,2-trichloroethane, and the like can be given.

Diazoketone Compounds

As examples of diazoketone compounds, 1,3-diketo-2-diazo compounds, diazobenzoquinone compounds, diazonaphthoquinone compounds, and the like can be given.

As specific examples of preferable diazoketone compounds,
1,2-naphthoquinonediazido-4-sulfonyl chloride,
1,2-naphthoquinonediazido-5-sulfonyl chloride,
1,2-naphthoquinonediazido-4-sulfonate or
1,2-naphthoquinonediazido-5-sulfonate of
2,3,4,4'-tetrahydroxybenzophenone;
1,2-naphthoquinonediazido-4-sulfonate or
1,2-naphthoquinonediazido-5-sulfonate of
1,1,1-tris(4-hydroxyphenyl)ethane, and the like can be given.

Sulfone Compounds

As examples of the sulfone compounds, β-ketosulfone, β-sulfonylsulfone, α-diazo compounds of these compounds, and the like can be given.

As specific examples of preferable sulfone compounds, 4-trisphenacylsulfone, mesitylphenacylsulfone, bis(phenylsulfonyl)methane, and the like can be given.

Sulfonate Compounds

As examples of the sulfonate compounds, alkyl sulfonate, alkylimide sulfonate, haloalkyl sulfonate, aryl sulfonate, imino sulfonate, and the like can be given.

As specific examples of sulfonate compounds, benzointosylate, pyrogallol tris(trifluoromethanesulfonate), nitrobenzyl-9,10-diethoxyanthracene-2-sulfonate, trifluoromethanesulfonylbicyclo[2.2.1]hepto-5-ene-2,3-dicarbodiimide, N-hydroxysuccinimidetrifluoromethanesulfonate, and 1,8-naphthalenedicarboxyimide trifluoromethanesulfonate can be given.

Of the above acid generators, the following compounds are preferable: diphenyliodoniumtrifluoromethanesulfonate, bis(4-t-butylphenyl)iodonium trifluoromethanesulfonate, bis(4-t-butylphenyl)iodonium nonafluoro-n-butanesulfonate, triphenylsulfonium trifluoromethanesulfonate, triphenylsulfonium nonafluoro-n-butanesulfonate, cyclohexyl.2-oxocyclohexyl.methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, 4-hydroxy-1-naphthyldimethylsulfonium trifluoromethanesulfonate, 4-hydroxy-1-naphthyltetrahydrothiophenium trifluoromethanesulfonate, 1-(1-naphthylacetomethyl)tetrahydrothiophenium trifluoromethanesulfonate, trifluoromethanesulfonylbicyclo[2.2.1]hepto-5-ene-2,3-dicarbodiimide, N-hydroxysuccinimidetrifluoromethanesulfonate, 1,8-naphthalenedicarboxyimide trifluoromethanesulfonate, and the like.

The acid generators may be used either individually or in combination of two or more.

To ensure sensitivity and developability, the amount of the acid generators used in the composition for pattern formation is usually 0.1–10 parts by weight, and preferably 0.5–7 parts by weight for 100 parts by weight of the acid-dissociable group-containing polysiloxane. If the amount of acid generator is less than 0.1 part by weight, sensitivity and developability may be decreased. If the amount exceeds 10 parts by weight, pattern configurations may be impaired due to decreased transparency to radiation.

Any solvent capable of dissolving the acid-dissociable group-containing polysiloxanes, acid generators, and additives can be used for preparing a solution of the pattern-forming composition without any specific limitation. Examples of the solvents that can be used include: linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; as well as other solvents such as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, 2-hydroxy-2-methylethyl propionate, ethoxyethyl acetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butylacetate, methyl acetoacetoate, ethyl acetoacetate, methyl pyruvate, ethyl pyruvate, N-methyl pyrrolidone, N,N-dimethylformamide, N,N-dimethylacetamide, benzyl ethyl ether, di n-hexyl ether, diethylene glycol monomethyl ether, diethylene glycol monoethyl ether, caproic acid, caprylic acid, 1-octanol, 1-nonanol, benzyl alcohol, benzylacetate, ethylbenzoate, diethyloxalate, diethylmaleate, γ-butyrolactone, ethylene carbonate, and propylene carbonate; and the like.

These solvents may be used either individually or in combination of two or more. Among these solvents, linear or branched ketones, cyclic ketones, propylene glycol monoalkyl ether acetates, alkyl 2-hydroxypropionates, and alkyl 3-alkoxypropionates are preferable.

The solvent is used in the solution of the pattern-forming composition in an amount to make the total solid content of the solution usually 1–25 wt %, and preferably 2–15 wt %.

Various additives such as an acid diffusion controller, solubility controller, surfactant, and the like may be added to the pattern-forming composition of the present invention.

The acid diffusion controller controls diffusion of an acid generated from the acid generator upon exposure to light in the resist film to hinder undesired chemical reactions in the unexposed area.

The addition of such an acid diffusion controller can improve storage stability and resolution of the resulting composition. Moreover, the addition of the acid diffusion controller prevents the line width of the pattern from changing due to changes in the post-exposure delay (PED) between exposure and post exposure baking, whereby a composition with remarkably superior process stability can be obtained.

As the acid diffusion controller, organic compounds containing nitrogen of which the basicity does not change during exposure or baking for forming a pattern are preferable.

As examples of such nitrogen-containing organic compounds, a compound shown by the following formula (23) (hereinafter called "nitrogen-containing compound (a)"),

(23)

wherein $R^{13}$ individually represents a hydrogen atom, a substituted or unsubstituted alkyl group, substituted or unsubstituted aryl group, or substituted or unsubstituted aralkyl group, a compound having two nitrogen atoms in the molecule (hereinafter referred to as "nitrogen-containing compound (b)"), a polymer having three or more nitrogen atoms in the molecule (hereinafter referred to as "nitrogen-containing compound (c)"), an amide group-containing compound, urea compound, nitrogen-containing heterocyclic compound, and the like can be given.

Examples of the nitrogen-containing compounds (a) include linear, branched, orcyclicmonoalkylamines such as n-hexylamine, n-heptylamine, n-octylamine, n-nonylamine, n-decylamine, and cyclohexylamine; linear, branched, or cyclicdialkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; linear, branched, or cyclic trialkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, dicyclohexylmethylamine, and tricyclohexylamine; aromatic amines such as aniline, N-methylaniline, N,N-dimethylaniline, 2-methylaniline, 3-methylaniline, 4-methylaniline, 2,6-di-t-butylaniline, 2,6-di-t-butyl-N-methylaniline, 2,6-di-t-butyl-N,N-dimethylaniline, 4-nitroaniline, diphenylamine, triphenylamine, and naphthylamine; and the like.

Examples of the nitrogen-containing compounds (b) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis (4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, and the like.

As examples of the nitrogen-containing compounds (c), polyethyleneimine, polyallylamine, a polymer of 2-dimethylaminoethylacrylamide, and the like can be given.

Examples of the amide group-containing compound include N-t-butoxycarbonyl group-containing amino compound such as N-t-butoxycarbonyl di-n-octylamine, N-t-butoxycarbonyl di-n-nonylamine, N-t-butoxycarbonyl di-n- decylamine, N-t-butoxycarbonyl dicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone; and the like can be given.

As examples of the urea compounds, urea, methylurea, 1,1-dimethylurea, 1,3-dimethylurea, 1,1,3,3-tetramethylurea, 1,3-diphenylurea, tri-n-butylthiourea, and the like can be given.

Examples of the nitrogen-containing heterocyclic compounds include: imidazoles such as imidazole, benzimidazole, 4-methylimidazole, and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine and 1-(2'-hydroxyethyl)piperazine; pyrazine, pyrazole, pyridazine, quinoxaline, purine, pyrrolidine, piperidine, morpholine, 4-methylmorpholine, 1,4-dimethylpiperazine, 1,4-diazabicyclo[2.2.2]octane; and the like.

Of these nitrogen-containing organic compounds, the nitrogen-containing organic compounds (a) and the nitrogen-containing heterocyclic compounds are preferable. Among the nitrogen-containing organic compounds (a), tri(cyclo)alkylamines are particularly preferable. Among the nitrogen-containing heterocyclic compounds, pyridines and piperazines are particularly preferable.

The acid diffusion controller may be used either individually or in combination of two or more.

The amount of the acid diffusion controller to be added is usually 15 parts by weight or less, preferably 10 parts by weight or less, and still more preferably 5 parts by weight or less for 100 parts by weight of the acid-dissociable group-containing polysiloxane. If the proportion of the acid diffusion controller exceeds 15 parts by weight, sensitivity of the resin and developability of the area exposed to light tend to decrease. If the amount is less than 0.001 part by weight, the pattern shape or dimensional accuracy may decrease depending on the processing conditions.

The compounds of the following formulas (24) or (25) can be given as examples of the dissolution controller.

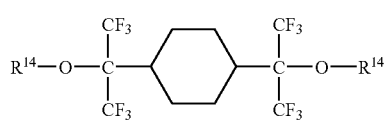

(24)

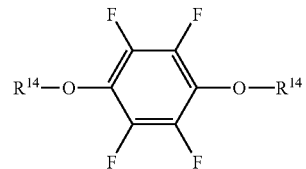

(25)

wherein $R^{14}$ individually represents a hydrogen atom, t-butyl group, t-butoxycarbonyl group, methoxymethyl group, ethoxymethyl group, 1-ethoxyethyl group, or tetrahydropyranyl group.

The amount of the dissolution controller to be added is usually 2–30 parts by weight, and preferably 5–20 parts by weight, for 100 parts by weight of the acid-dissociable group-containing polysiloxane.

Surfactants improve applicability, developability, and the like of the radiation-sensitive resin composition.

As examples of surfactants, nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, polyethylene glycol distearate; commercially available products such as KP341 (manufactured by Shin-Etsu Chemical Co., Ltd.), Polyflow No. 75, No. 95 (manufactured by Kyoeisha Chemical Co., Ltd.), FTOP EF301, EF303, EF352 (manufactured by TOHKEM PRODUCTS CORPORATION), MEGAFAC F171, F173 (manufactured by Dainippon Ink and Chemicals, Inc.), Fluorard FC430, FC431 (manufactured by Sumitomo 3M Ltd.), Asahi Guard AG710, Surflon S-382, SC-101, SC-102, SC-103, SC-104, SC-105, SC-106 (manufactured by Asahi Glass Co., Ltd.); and the like can be given.

These surfactants may be used either individually or in combination of two or more.

The amount of surfactants to be added is usually 2 parts by weight or less for 100 parts by weight of the total of the acid-dissociable group-containing polysiloxane and the acid generator.

As other additives, halation inhibitors, adhesion promoters, storage stabilizers, anti-foaming agents, and the like can be given.

The solution of the pattern-forming composition is usually filtered through a filter with about 0.2 μm pore size before using for pattern formation.

Pattern Forming Method

As a pattern forming method of the present invention, a method comprising: 1) a step of forming an under layer film on a substrate by applying the under layer film-forming composition onto the substrate and baking the coating, 2) a step of forming a bilayer film by applying the solution of the pattern-forming composition onto the under layer film and baking the applied coating (hereinafter referred to as "resist coating"), 3) a step of exposing selected areas of the resist coating to radiation through a mask for exposure, 4) step of developing the exposed resist coating to form a resist pattern, and, if required, 5) a step of etching the under layer film using the resist pattern as a mask can be given.

There is no specific limitation to the substrate used for pattern formation. Inorganic substrates such as a silicon-type oxide film, interlayer dielectric film, and the like can be given as examples.

In the step 1), after applying the under layer film-forming composition on the substrate by an appropriate means such as rotation coating, cast coating, or roll coating, for example, the resulting coating is baked to volatilize solvents, thereby forming the under layer film.

The baking temperature is usually from 90 to 500° C., and preferably from 200 to 450° C.

The thickness of the under layer film is usually 10–10,000 nm, and preferably 50–1,000 nm.

In the step 2), the resist film having a specific thickness is formed by applying the solution of pattern-forming composition on the under layer film using an appropriate means such as rotation coating, cast coating, or roll coating, for example, and prebaking the resulting coating to volatilize the solvent, thereby obtaining a bilayer film.

In this instance, a prebake temperature is appropriately adjusted according to the pattern-forming composition in the range usually from 30 to 200° C., and preferably from 50 to 160° C.

The thickness of the resist film is usually 10–10,000 nm, preferably 50–1,000 nm, and particularly preferably 70–300 nm.

Next, in the step 3) the resist film is selectively exposed to radiation through a mask for exposure.

As radiation used for exposure, visible rays, ultraviolet rays, deep ultraviolet rays, X-rays, electron beams, γ-rays, molecular beams, ionbeams, or the like is appropriately selected depending on the pattern-forming composition. It is particularly preferable to use deep ultraviolet rays such as a KrF excimer laser (wavelength: 248 nm), ArF excimer laser (wavelength: 193 nm), F2 excimer laser (wavelength: 157 nm), and super-deep ultraviolet rays (EUV) or X-rays. An ArF excimer laser and F2 excimer laser are ideal deep ultraviolet rays.

Next, in the step 4), the exposed resist film is developed to form a resist pattern.

As examples of a developer used for development, an alkaline aqueous solution prepared by dissolving alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-[5.4.0]-7-undecene, and 1,5-diazabicyclo-[4.3.0]-5-nonene can given.

An appropriate amount of a water-soluble organic solvent such as methanol and ethanol or surfactants can be added to these alkaline aqueous solutions.

The resist film is then washed with water and dried to obtain a desired resist pattern.

In this step, post-baking may be carried out before development to improve resolution, pattern forms, developability, and the like.

In the step 5), if required, the under layer film is etched using the obtained resist patter as a mask and gas plasmas such as fluorine plasma, chlorine plasma, bromine plasma, or the like to obtain a desired pattern.

However, the pattern forming method of the present invention is not limited to these methods.

EXAMPLES

The present invention will be described in more detail by way of examples. However, these examples should not be construed as limiting the present invention.

In the examples, part(s) and % refer to part(s) by weight and wt % unless otherwise indicated.

Mw of the polymers obtained in the following Synthetic Examples was measured by gel permeation chromatography (detector: differential refractometer) using GPC columns (manufactured by Tosoh Corp., G2000H$^{XL}$×2, G3000H$^{XL}$×1, G4000H$^{XL}$×1) under the following conditions. Flow rate: 1.0 ml/minute, eluate: tetrahydrofuran, column temperature: 40° C., standard reference material: monodispersed polystyrene.

Synthesis Example 1-1

Preparation of Under Layer Film Polymer

A separable flask equipped with a thermometer was charged with 100 parts of acenaphthylene, 78 parts of toluene, 52 parts of dioxane, and 3 parts of azobisisobutyronitrile under nitrogen atmosphere. The mixture was stirred for 5 hours at 70° C. Next, 5.2 parts of p-toluenesulfonic acid monohydrate and 40 parts of paraformaldehyde were added. After heating to 120° C., the mixture was stirred for 6 hours. The reaction solution was charged into a large amount of isopropanol. The resulting precipitate was collected by filtration and dried at 40° C. under reduced pressure to obtain a polymer.

Mw of the polymer was found to be 22,000 and $^1$H-NMR analysis confirmed that the polymer has the structural unit of the following formula (26).

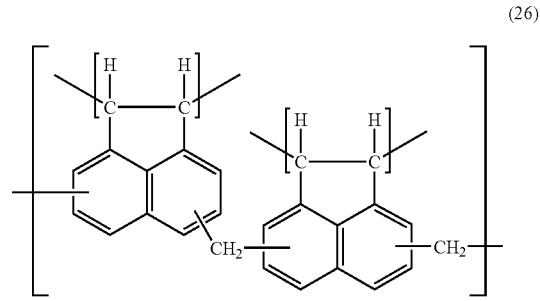

(26)

Synthesis Example 1-2

Preparation of Under Layer Film Polymer

A separable flask equipped with a thermometer was charged with 6 parts of acenaphthylene, 5 parts of 4-hydroxymethylstyrene, 48 parts of n-butylacetate, and 4 parts of azobisisobutyronitrile under nitrogen atmosphere. The mixture was stirred for 7 hours at 75° C.

The reaction solution was diluted with 100 parts of n-butyl acetate and charged into a large amount of a water/methanol mixture (weight ratio=1/2). The resulting precipitate was collected by filtration and the solvent was evaporated to obtain a polymer with an Mw of 1,200.

Synthesis Example 2

Synthesis of Silane Compound

A three-necked flask equipped with a stirrer, a reflux condenser, and a thermometer was charged with 76.0 g of triethoxysilane and 100 g of 8-t-butoxycarbonyltetracyclo [4.4.0.1$^{2,5}$.1$^{7,10}$]dodec-3-ene. The mixture was stirred at room temperature and 5.0 ml of a 0.2 mol chloroplatinic acid (H$_2$PtCl$_6$) solution in i-propyl alcohol was added to initiate the reaction. The reaction was continued for 75 hours at 150° C. while refluxing. The reaction mixture was allowed to cool to room temperature, diluted with n-hexane, and filtered through celite by suction. The solvent was removed from the filtrate by evaporation under vacuum to obtain a crude product. The residue was purified by silica gel column chromatography to obtain 53 g of a reaction product as a n-hexane fraction. As shown by the following results of $^1$H-NMR spectrum (chemical shift σ) and IR spectrum measurement, this reaction product was identified to be the compound shown by the following formula (27).

σ: 3.8 ppm (ethoxy group), 1.2 ppm (ethoxy group), 1.4 ppm (t-butyl group) IR: 2885 cm$^{-1}$ (ethoxy group), 1726 cm$^{-1}$ (ester group), 1153 cm$^{-1}$ (siloxane group), 1080 cm$^{-1}$ (siloxane group)

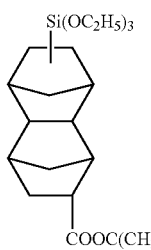

(27)

wherein the silicon atom bonds to the 3-position or 4-position of the tetracyclo[4.4.0.1$^{2,5}$.1$^{7,10}$]dodecane ring.

Synthesis Example 3

Synthesis of Silane Compound

A three-necked flask equipped with a stirrer, a reflux condenser, and a thermometer was charged with 38.8 g of triethoxysilane and 43.2 g of 5-[2-hydroxy-2,2-di(trifluoromethyl)]bicyclo[2.2.1]hepto-2-ene. The mixture was stirred at room temperature and 0.1 ml of a 0.2 mol chloroplatinic acid (H$_2$PtCl$_6$) solution in isopropyl alcohol was added to initiate the reaction. The reaction was continued for 30 hours at 100° C. while refluxing The reaction mixture was allowed to cool to room temperature, diluted with n-hexane, and filtered through celite by suction. The solvent was removed from the filtrate by evaporation under vacuum to obtain a crude product. The crude product was purified by vacuum distillation at 3 mmHg and a temperature of 105° C. to obtain 59.8 g of a reaction product.

As shown by the following results of $^1$H-NMR spectrum (chemical shift σ) and IR spectrum measurement, this reaction product was identified to be the compound shown by the following formula (28).

σ: 3.8 ppm (ethoxy group), 1.2 ppm (ethoxy group) IR: 3400 cm$^{-1}$ (hydroxyl group), 2878 cm$^{-1}$ (methoxy group), 1215 cm$^{-1}$ (C—F bond), 1082 cm$^{-1}$ (siloxane group)

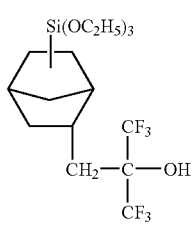

(28)

wherein the silicon atom bonds to the 2-position or 3-position of the bicyclo[2.2.1]heptane ring.

Synthesis Example 4

Synthesis of Silane Compound

A three-necked flask equipped with a stirrer, a reflux condenser, and a thermometer was charged with 3.0 g of the compound of the above formula (28), and 10 ml of tetrahydrofuran. The mixture was stirred in a nitrogen stream while cooling with ice. When the mixture was cooled to 5° C., 16.7 mg of 4-dimethylaminopyridine was added and a solution of 1.64 g of di-t-butyldicarbonate in 5 ml of tetrahydrofuran was added dropwise over 15 minutes. After the addition, the mixture was stirred for one hour, allowed to cool to room temperature, and stirred for a further five hours. After the addition of 50 ml of n-hexane, the reaction mixture was poured into a separating funnel. The organic layer was washed three times with ice-cooled water, charged into a beaker, and dried over anhydrous magnesium sulfate. The solvent was evaporated under vacuum to obtain a crude product. The crude product was purified by silica gel column chromatography to obtain 3.5 g of a reaction product from the n-hexane fraction.

As shown by the following results of NMR spectrum (chemical shift σ) and IR spectrum measurement, this reaction product was identified to be the compound shown by the following formula (29).

σ: 3.8 ppm (ethoxy group), 1.2 ppm (ethoxy group), 1.5 ppm (t-butyl group) IR: 3400 cm$^{-1}$ (hydroxyl group), 2879 cm$^{-1}$ (methoxy group), 1774 cm$^{-1}$ (carbonate group), 1221 cm$^{-1}$ (C—F bond), 1082 cm$^{-1}$ (siloxane group)

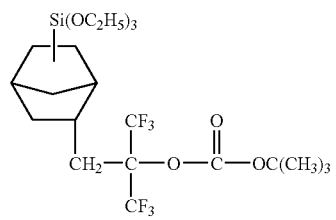

(29)

wherein the silicon atom bonds to the 2-position or 3-position of the bicyclo[2.2.1]heptane ring.

Synthesis Example 5

Synthesis of Silane Compound

A three-necked flask equipped with a stirrer, a reflux condenser, and a thermometer was charged with 20.6 g of triethoxysilane and 25 g of 5-trifluoromethyl-5-t-butoxycarbonylbicyclo[2.2.1]hepto-2-e ne. The mixture was stirred at room temperature and 1.0 ml of a 0.2 mol chloroplatinic acid (H$_2$PtCl$_6$) solution in isopropyl alcohol was added to initiate the reaction. The reaction was continued for 24 hours at 140° C. while refluxing. The reaction mixture was allowed to cool to room temperature, diluted with n-hexane, and filtered through celite by suction. The solvent was removed from the filtrate by evaporation under vacuum to obtain a crude product. The crude product was purified by vacuum distillation at 0.5 mmHg and a temperature of 140° C. to obtain 21 g of a reaction product.

As shown by the following results of ¹H-NMR spectrum (chemical shift σ) and IR spectrum measurement, this reaction product was identified to be the compound shown by the following formula (30). σ: 3.8 ppm (ethoxy group), 1.2 ppm (ethoxy group), 1.4 ppm (t-butoxy group) IR: 1730 cm⁻¹ (ester group), 1270 cm⁻¹ (C—F bond), 1155 cm⁻¹ (Si—O bond), 1080 cm⁻¹ (Si—O bond)

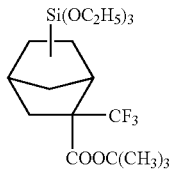

(30)

wherein the silicon atom bonds to the 2-position or 3-position of the bicyclo[2.2.1]heptane ring.

Synthesis Example 6

Preparation of Acid-dissociable Group-containing Polysiloxane

A three-necked flask equipped with a stirrer, a reflux condenser, and a thermometer was charged with 8.34 g of the silane compound prepared in Synthesis Example 2, 12.92 g of the silane compound prepared in Synthesis Example 3, 8.75 g of methyltriethoxysilane, 30 g of 4-methyl-2-pentanone, and 7.20 g of 1.75% oxalic acid aqueous solution. The mixture was reacted for 6 hours at 80° C. while stirring. The reaction was terminated by cooling the flask with ice. The reaction mixture was poured into a separating funnel to remove the water layer. The organic layer was repeatedly washed with ion-exchanged water until the reaction solution becomes neutral. The solvent evaporated under reduced pressure from the organic layer to obtain 18.5 g of a polymer.

¹H-NMR spectrum (chemical shift σ), Mw, and Mn of the polymer were measured. The results were as follows. σ: 2.3 ppm (CH₂C(CF₃)₂ group), 1.4 ppm (t-butyl group), 0.2 ppm (SiCH₃ group) Mw: 2,300 Mw/Mn: 1:1

Synthesis Example 7

Preparation of Acid-dissociable Group-containing Polysiloxane

A three-necked flask equipped with a stirrer, a reflux condenser, and a thermometer was charged with 3.84 g of the silane compound prepared in Synthesis Example 2, 7.93 g of the silane compound prepared in Synthesis Example 3, 3.22 g of methyltriethoxysilane, 15 g of 4-methyl-2-pentanone, and 3.32 g of 1.75% oxalic acid aqueous solution. The mixture was reacted for 6 hours at 80° C. while stirring. The reaction was terminated by cooling the flask with ice. The reaction mixture was poured into a separating funnel to remove the water layer. The organic layer was repeatedly washed with ion-exchanged water until the reaction solution becomes neutral. The solvent was evaporated under reduced pressure from the organic layer to obtain 8.24 g of a polymer.

¹H-NMR spectrum (chemical shift σ), Mw, and Mn of the polymer were measured. The results were as follows. σ: 2.3 ppm (CH₂C(CF₃)₂ group), 1.4 ppm (t-butyl group), 0.2 ppm (SiCH₃ group) Mw: 2,200 Mw/Mn: 1:1

Synthesis Example 8

Preparation of Acid-dissociable Group-containing Polysiloxane

A three-necked flask equipped with a stirrer, a reflux condenser, and a thermometer was charged with 1.90 g of the silane compound prepared in Synthesis Example 2, 6.89 g of the silane compound prepared in Synthesis Example 3, 1.21 g of the silane compound prepared in Synthesis Example 4, 10.0 g of 4-methyl-2-pentanone, and 1.65 g of 1.75% oxalic acid aqueous solution. The mixture was reacted for 10 hours at 40° C. while stirring. The reaction was terminated by cooling the reaction solution with ice. The reaction mixture was poured into a separating funnel to remove the water layer. The organic layer was repeatedly washed with ion-exchanged water until the reaction solution becomes neutral. The solvent was evaporated under reduced pressure from the organic layer to obtain 7.5 g of a viscous oily polymer. The polymer had Mw of 1,500 and an Mw/Mn ratio of 1.1.

The polymer was dissolved in 22.5 g of 4-methyl-2-pentanone. After the addition of 2.43 g of distilled water and 3.40 g of triethylamine, the mixture was heated to 60° C. in a nitrogen stream and reacted for 5 hours. After stirring while cooling with ice, a solution of 2.83 g of oxalic acid in 70 g of distilled water was added to the reaction solution, followed by continued stirring. The reaction mixture was poured into a separating funnel to remove the water layer. The organic layer was repeatedly washed with ion-exchanged water until the reaction solution becomes neutral. The solvent was evaporated under reduced pressure from the organic layer to obtain 7.38 g of a solid polymer.

¹H-NMR spectrum (chemical shift σ), IR spectrum, Mw, and Mn of the polymer were measured. The results were as follows. σ: 2.3 ppm (CH₂C(CF₃)₂ group), 1.5 ppm (t-butoxycarbonyl group), 1.4 ppm (t-butoxy group) IR: 1775 cm⁻¹ (carbonate group), 1726 cm⁻¹ (ester group), 1221 cm⁻¹ (C—F bond), 1133 cm⁻¹ (siloxane group) Mw: 2,300 Mw/Mn: 1:1

Synthesis Example 9

Preparation of Acid-dissociable Group-containing Polysiloxane

A three-necked flask equipped with a stirrer, a reflux condenser, and a thermometer was charged with 1.28 g of the silane compound prepared in Synthesis Example 2, 3.30 g of the silane compound prepared in Synthesis Example 3, 2.43 g of the silane compound prepared in Synthesis Example 4, 7.0 g of 4-methyl-2-pentanone, and 1.10 g of 1.75% oxalic acid aqueous solution. The mixture was reacted for 10 hours at 40° C. while stirring. The reaction was terminated by cooling the reaction solution with ice. The reaction mixture was poured into a separating funnel to remove the water layer. The organic layer was repeatedly washed with ion-exchanged water until the reaction solution becomes neutral. The solvent was evaporated under reduced pressure from the organic layer to obtain 5.2 g of a viscous oily polymer. The polymer Mw of 1,400 and an Mw/Mn ratio of 1.1.

The polymer was dissolved in 16.0 g of 4-methyl-2-pentanone. After the addition of 1.63 g of distilled water and 2.28 g of triethylamine, the mixture was heated to 60° C. in a nitrogen stream and reacted for 5 hours. After stirring while cooling with ice, a solution of 1.90 g of oxalic acid in 50 g of distilled water was added to the reaction solution, followed by continued stirring. The reaction mixture was poured into a separating funnel to remove the water layer. The organic layer was repeatedly washed with ion-exchanged water until the reaction solution becomes neutral. The solvent was evaporated under reduced pressure from the organic layer to obtain 5.03 g of a solid polymer.

$^1$H-NMR spectrum (chemical shift σ), IR spectrum, Mw, and Mw/Mn of the polymer were measured. The results were as follows. σ: 2.3 ppm ($CH_2C(CF_3)_2$ group), 1.5 ppm (t-butoxycarbonyl group), 1.4 ppm (t-butoxy group) IR: 1776 cm$^{-1}$ (carbonate group), 1726 cm$^{-1}$ (ester group), 1221 cm$^{-1}$ (C—F bond), 1132 cm$^{-1}$ (siloxane group) Mw: 2,300 Mw/Mn: 1:1

Synthesis Example 10

Preparation of Acid-dissociable Group-containing Polysiloxane

A three-necked flask equipped with a stirrer, a reflux condenser, and a thermometer was charged with 17.98 g of the silane compound prepared in Synthesis Example 3, 12.02 g of the silane compound prepared in Synthesis Example 5, 30 g of 4-methyl-2-pentanone, and 5.47 g of 1.75% oxalic acid aqueous solution. The mixture was reacted for 6 hours at 80° C. while stirring. The reaction was terminated by cooling the reaction solution with ice. The reaction mixture was poured into a separating funnel to remove the water layer. The organic layer was repeatedly washed with ion-exchanged water until the reaction solution becomes neutral. The solvent was evaporated under reduced pressure from the organic layer to obtain a polymer.

The polymer was dissolved in 65.1 g of 4-methyl-2-pentanone. After the addition of 8.06 g of distilled water and 11.31 g of triethylamine, the mixture was heated to 60° C. in a nitrogen stream and reacted for 6 hours. After stirring while cooling with ice, a solution of 9.4 g of oxalic acid in 188 g of distilled water was added to the reaction solution, followed by continued stirring. The reaction mixture was poured into a separating funnel to remove the water layer. The organic layer was repeatedly washed with ion-exchanged water until the reaction solution becomes neutral. The solvent was evaporated under reduced pressure from the organic layer to obtain 21.2 g of a polymer. The polymer had Mw of 2,000 and an Mw/Mn ratio of 1.0.

Synthesis Example 11

Preparation of Acid-dissociable Group-containing Polysiloxane

A three-necked flask equipped with a stirrer, a reflux condenser, and a thermometer was charged with 4.05 g of the silane compound prepared in Synthesis Example 2, 12.54 g of the silane compound prepared in Synthesis Example 3, 3.42 g of the silane compound prepared in Synthesis Example 5, 20 g of 4-methyl-2-pentanone, and 3.5 g of 1.75% oxalic acid aqueous solution. The mixture was reacted for 6 hours at 80° C. while stirring. The reaction was terminated by cooling the reaction solution with ice. The reaction mixture was poured into a separating funnel to remove the water layer. The organic layer was repeatedly washed with ion-exchanged water until the reaction solution becomes neutral. The solvent was evaporated under reduced pressure from the organic layer to obtain a polymer.

The polymer was dissolved in 44.1 g of 4-methyl-2-pentanone. After the addition of 5.15 g of distilled water and 7.23 g of triethylamine, the mixture was heated to 60° C. in a nitrogen stream and reacted for 6 hours. After stirring while cooling with ice, a solution of 6.01 g of oxalic acid in 120 g of distilled water was added to the reaction solution, followed by continued stirring. The reaction mixture was poured into a separating funnel to remove the water layer. The organic layer was repeatedly washed with ion-exchanged water until the reaction solution becomes neutral. The solvent was evaporated under reduced pressure from the organic layer to obtain 14.4 g of a polymer. The polymer had Mw of 1,800 and an Mw/Mn ratio of 1.0.

Preparation Example 1

Preparation of Under Layer Film-forming Composition 10 parts of the under layer film polymer obtained in Synthesis Example 1-1, 0.5 part of bis(4-t-butylphenyl) iodonium 10-camphorsulfonate, 0.5 part of 4,4'-{1-[4-(1-[4-hydroxyphenyl]-1-methylethyl)phenyl} ethylidene] bisphenol, and 89 parts of cyclohexanone were mixed to prepare a homogeneous solution. The solution was filtered using a membrane filter with a pore diameter of 0.1 μm to prepare an under layer film-forming composition.

Preparation Example 2

Preparation of Under Layer Film-forming Composition 10 parts of the under layer film polymer obtained in Synthesis Example 1-2, 0.5 part of bis (4-t-butylphenyl) iodonium 10-camphorsulfonate, 0.5 part of 4,4'-[1-{4-(1-[4-hydroxyphenyl]-1-methylethyl)phenyl} ethylidene] bisphenol, and 89 parts of cyclohexanone were mixed to prepare a homogeneous solution. The solution was filtered using a membrane filter with a pore diameter of 0.1 μm to prepare an under layer film-forming composition.

Preparation Example 3

Preparation of Pattern-forming Composition Solution

A composition solution was prepared by homogeneously mixing 50 parts of the acid-dissociable group-containing polysiloxane obtained in Synthesis Example 6, 50 parts of acid-dissociable group-containing polysiloxane obtained in Synthesis Example 6, 0.08 part of tri-n-octylamine, 900 parts of 2-heptanone, and 1 part of triphenylsulfonium heptadecafluoro-n-octanesulfonate. The solution was filtered using a membrane filter with a pore diameter of 0.45 μm to prepare a pattern-forming composition solution.

Preparation Example 4

Preparation of Pattern-forming Composition Solution

A composition solution was prepared by homogeneously mixing 100 parts of the acid-dissociable group-containing polysiloxane obtained in Synthesis Example 8, 0.08 part of tri-n-octylamine, 900 parts of 2-heptanone, and 1 part of triphenylsulfonium heptadecafluoro-n-octanesulfonate. The solution was filtered using a membrane filter with a pore diameter of 0.45 μm to prepare a pattern-forming composition solution.

Preparation Example 5

Preparation of Pattern-forming Composition Solution

A composition solution was prepared by homogeneously mixing 100 parts of the acid-dissociable group-containing polysiloxane obtained in Synthesis Example 9, 0.08 part of tri-n-octylamine, 900 parts of 2-heptanone, and 1 part of triphenylsulfonium heptadecafluoro-n-octanesulfonate. The solution was filtered using a membrane filter with a pore diameter of 0.45 μm to prepare a pattern-forming composition solution.

Preparation Example 6

Preparation of Pattern-forming Composition Solution

A composition solution was prepared by homogeneously mixing 100 parts of the acid-dissociable group-containing polysiloxane obtained in Synthesis Example 10, 0.32 part of 2-phenylbenzimidazol, 900 parts of 2-heptanone, 3 part of triphenylsulfoniumnonafluoro-n-butanesulfonate, and 1 part of triphenylsulfonium 10-camphorsulfondte. The solution was filtered using a membrane filter with a pore diameter of 0.45 μm to prepare a pattern-forming composition solution.

Preparation Example 7

Preparation of Pattern-forming Composition Solution

A composition solution was prepared by homogeneously mixing 100 parts of the acid-dissociable group-containing polysiloxane obtained in Synthesis Example 11, 0.32 part of 2-phenylbenzimidazol, 900 parts of 2-heptanone, 3 part of triphenylsulfoniumnonafluoro-n-butanesulfonate, and 1 part of triphenylsulfonium 10-camphorsulfonate. The solution was filtered using a membrane filter with a pore diameter of 0.45 μm to prepare a pattern-forming composition solution.

Evaluation Example 1

Evaluation of $SiO_2$ Etching Resistivity

The $SiO_2$ etching speed of films formed on a silicon wafer from under layer film-forming compositions prepared in Preparation Examples 1 and 2 or a common novolac resin was measured. An IEM etcher manufactured by Tokyo Electron Co., Ltd. was used under the following conditions: etching gas $C_4F_8/Ar/O_2$=11/400/8 SCCM, degree of vacuum: 30 m Torr, cathode power amplification Top/Bottom=2000/1200 w, substrate temperature: Bottom/Top/Wall=−20/−30/−40° C., etching time: 30 seconds.

As a result, the etching speed of the films formed from the under layer film-forming compositions prepared in the Preparation Examples 1 and 2 was 50.1 nm/minute and 52.7 nm/minute, respectively, whereas the etching speed of the film formed from the novolac resin was 63.7 mm/minute, indicating the former films have the etching resistivity 1.27 times and 1.21 times, respectively, as much as the etching resistivity of the latter film. Thus, the films formed from the under layer film-forming compositions were shown to exhibit extremely excellent etching resistivity under the etching conditions employed when forming contact holes in silicon wafer.

Evaluation Example 2

Evaluation of Organic Film Etching Resistivity

The organic film etching speed of films formed on a silicon wafer from the under layer film-forming composition prepared in Preparation Example 1 and the pattern forming composition solution in Preparation Example 2 was measured. A Lam TCP-9400 unit manufactured by Lam Co., Ltd. was used under the following conditions: etching gas $O_2/SO_2$=230/10 SCCM, degree of vacuum: 5 m Torr, cathode power Top/Bottom=200/5 w, substrate temperature=−5° C., etching time: 30 seconds.

As a result, the etching speed of the film formed from the pattern-forming composition solution was 19.3 nm/minute, whereas that of the film formed from the under layer film-forming composition was 512 nm/minute, indicating the former film has the etching resistivity 26.5 times as much as the etching resistivity of the latter film. Thus, the film formed from the under layer film-forming composition solution was shown to exhibit extremely excellent dry etching resistivity as compared with the film formed from the under layer film-forming composition under the organic film etching conditions.

Based on the evaluation results of the above $SiO_2$ etching resistivity and organic film etching resistivity, the pattern forming method and the bilayer film of the present invention have been demonstrated to be very useful in the future lithography processes.

Evaluation Example 3 n Value and k Value

Optical coefficients (n value and k value) of the film formed from the under layer film-forming composition prepared in Preparation Example 1 were measured. The measurement results of each wavelength are shown in Table 1.

TABLE 1

| | Wavelength | | | |
| --- | --- | --- | --- | --- |
| | 365 nm | 248 nm | 193 nm | 157 nm |
| n value | 1.08 | 2.17 | 1.43 | 1.39 |
| k value | 0.03 | 0.31 | 0.34 | 0.31 |

The results show that the under layer film formed from the under layer film-forming composition exhibits superior of a reflection preventing effect at a wavelength of less than 193 nm.

Comparative Example 1

Evaluation of Exposure to ArF Excimer Laser

The pattern-forming composition solution prepared in Preparation Example 3 was applied on to a silicon wafer substrate previously treated with hexamethyldisilazane by spin coating and pre-baked for 90 seconds on a hot plate at 140° C. to form a resist film with a thickness of 100 nm.

The resist film was exposed to an ArF excimer laser (wavelength: 193 nm) while changing the irradiation dose, post-baked for 90 seconds on a hot plate maintained at a temperature of 110° C., and then developed in a 2.38 wt % aqueous solution of tetramethylammonium hydroxide, thereby forming a line-and-space pattern (1L/1S).

The resulting pattern was inspected by a scanning-type electron microscope to confirm that the pattern was resolved to a line size as fine as 0.16 μm, but the side of the pattern was conspicuously roughened by standing waves.

Reference Example 1

Evaluation of Exposure to ArF Excimer Laser

The pattern-forming composition solution prepared in Preparation Example 3 was applied onto a silicon wafer substrate, with a commercially available reflection preventing film (DUV-30J) with a thickness of 52 nm, by spin coating and pre-baked for 90 seconds on a hot plate at 140° C. to form a resist film with a thickness of 100 nm.

The resist film was exposed to an ArF excimer laser (wavelength: 193 nm) while changing the irradiation dose, post-baked for 90 seconds on a hot plate maintained at a temperature of 110° C., and then developed in a 2.38 wt % aqueous solution of tetramethylammonium hydroxide, thereby forming a line-and-space pattern (1L/1S).

The resulting pattern was inspected by a scanning-type electron microscope to confirm that the pattern was resolved to a line size as fine as 0.14 μm. There was almost no roughness on the side of the pattern due to standing waves observed.

Example 1

Evaluation of Exposure to ArF Excimer Laser

The under layer film-forming composition prepared in Preparation Example 1 was applied onto a silicon wafer by spin coating to form an under layer film with a thickness of 300 nm. The film was pre-baked at 180° C. for 60 seconds, then post-baked at 300° C. for 120 seconds to form an under layer film.

The pattern-forming composition solution prepared in Preparation Example 3 was applied onto a silicon wafer substrate, on which the above under layer film had been formed, by spin coating and pre-baked for 90 seconds on a hot plate at 140° C. to form a resist film with a thickness of 100 nm.

The resist film was exposed to an ArF excimer laser (wavelength: 193 nm, numerical aperture (NA)=0.55, and σ=0.60) while changing the irradiation dose, post-baked for 90 seconds on a hot plate maintained at a temperature of 110° C., and then developed in a 2.38 wt % aqueous solution of tetramethylammonium hydroxide, thereby forming a line-and-space pattern (1L/1S).

The resulting pattern was inspected by a scanning-type electron microscope to confirm that the pattern was resolved to a line size as fine as 0.14 μm. There was almost no roughness on the side of the pattern due to standing waves observed.

Examples 2–5

Evaluation of Exposure to ArF Excimer Laser

Line-and-space patterns (1L/1S) were prepared in the same manner as in Example 1, except for using the pattern-forming composition solutions prepared in the Preparation Examples 4–7 instead of the composition solution of Preparation Example 3, and changing the both pre-baking and post-baking temperatures to 100° C.

The resulting patterns were inspected by a scanning-type electron microscope to confirm that the both patterns were resolved to a line size as fine as 0.14 μm. There was almost no roughness on the side of the pattern due to standing waves observed.

Example 6

Evaluation of Exposure to ArF Excimer Laser

Line-and-space patterns (1L/1S) were prepared in the same manner as in Example 1, except for using the under layer film-forming composition prepared in Preparation Example 1 instead of the composition of Preparation Example 2.

The resulting patterns were inspected by a scanning-type electron microscope to confirm that the both patterns were resolved to a line size as fine as 0.14 μm. There was almost no roughness on the side of the pattern due to standing waves observed.

Examples 7–10

Evaluation of Exposure to ArF Excimer Laser

Line-and-space patterns (1L/1S) were prepared in the same manner as in Example 6, except for using the pattern-forming composition solutions prepared in the Preparation Example 4–7 instead of the composition solution of Preparation Example 3, and changing the both pre-baking and post-baking temperatures to 100° C.

The resulting patterns were inspected by a scanning-type electron microscope to confirm that the both patterns were resolved to a line size as fine as 0.14 μm. There was almost no roughness on the side of the pattern due to standing waves observed.

Comparative Example 2

Evaluation of Exposure to F2 Excimer Laser

The pattern-forming composition solution prepared in Preparation Example 3 was applied onto a silicon wafer substrate previously treated with hexamethyldisilazane by spin coating and pre-baked for 90 seconds on a hot plate at 140° C. to form a resist film with a thickness of 100 nm.

The resist film was exposed to an F2 excimer laser (wavelength: 157 nm) while changing the irradiation dose, post-baked for 90 seconds on a hot plate maintained at a temperature of 110° C., and then developed in a 2.38 wt % aqueous solution of tetramethylammonium hydroxide, thereby forming a line-and-space pattern (1L/1S).

The resulting pattern was inspected by a scanning-type electron microscope to confirm that the pattern was resolved only to a line size of 0.13 μm due to conspicuously roughened side of the pattern by standing waves.

Example 11

Evaluation of Exposure to F2 Exciter Laser

The under layer film-forming composition prepared in Preparation Example 1 was applied onto a silicon wafer by spin coating to form an under layer film with a thickness of 300 nm. The film was pre-baked at 180° C. for 60 seconds, then post-baked at 300° C. for 120 seconds to form an under layer film.

The pattern-forming composition solution prepared in Preparation Example 3 was applied onto a silicon wafer substrate, on which the above under layer film had been formed, by spin coating and pre-baked for 90 seconds on a hot plate at 140° C. to form a resist film with a thickness of 120 nm.

The resist film was exposed to an F2 excimer laser (wavelength: 157 nm, numerical aperture (NA)=0.60, and σ=0.70) using a binary mask as a reticle while changing the irradiation dose, post-baked for 90 seconds on a hot plate maintained at a temperature of 110° C., and then developed in a 2.38 wt % aqueous solution of tetramethylammonium hydroxide, thereby forming a line-and-space pattern (1L/1S).

The resulting pattern was inspected by a scanning-type electron microscope to confirm that the pattern was resolved to a line size as fine as 0.10 μm. There was almost no roughness on the side of the pattern due to standing waves observed.

Examples 12–15

Evaluation of Exposure to F2 Excimer Laser line-and-space patterns (1L/1S) were prepared in the same manner as in Example 11, except for using the pattern-forming composition solutions prepared in the Preparation Examples 4–7 instead of the composition solution of Preparation Example 3, and changing the both pre-baking and post-baking temperatures to 100° C.

The resulting pattern was inspected by a scanning-type electron microscope to confirm that the pattern was resolved to a line size as fine as 0.10 μm. There was almost no roughness on the side of the pattern due to standing waves observed.

Example 16

Evaluation of Exposure to F2 Excimer Laser

Line-and-space patterns (1L/1S) were prepared in the same manner as in Example 11, except for using the under layer film-forming composition prepared in Preparation Example 1 instead of the composition of Preparation Example 2.

The resulting patterns were inspected by a scanning-type electron microscope to confirm that the both patterns were resolved to a line size as fine as 0.10 μm. There was almost no roughness on the side of the pattern due to standing waves observed.

Example 17–20

Evaluation of Exposure to F2 Excimer Laser

Line-and-space patterns (1L/1S) were prepared in the same manner as in Example 16, except for using the pattern-forming composition solutions prepared in the Preparation Examples 4–7 instead of the composition solution of Preparation Example 3, and changing the both pre-baking and post-baking temperatures to 100° C.

The resulting patterns were inspected by a scanning-type electron microscope to confirm that both patterns were resolved to a line size as fine as 0.10 μm. There was almost no roughness on the side of the pattern due to standing waves observed.

Examples 21–25

Evaluation of Exposure to F2 Excimer Laser

Line-and-space patterns (1L/1S) for Examples 11-15 were prepared in the same manner as in Examples 11-15, respectively, except for using a Levenson mask as the reticle.

The resulting pattern was inspected by a scanning-type electron microscope to confirm that the pattern was resolved to a line size as fine as 0.07 μm. There was almost no roughness on the side of the pattern due to standing waves observed.

Examples 26–30

Pattern Transfer Test After Exposure to F2 Excimer Laser

The pattern transfer test by under layer film etching of Examples 21–25 was carried out using the line-and-space patterns (1L/1S) obtained respectively in Examples 21–25 as masks. A Lam TCP-9400 unit manufactured by Lam Co., Ltd. was used under the following conditions: etching gas $O_2/SO_2$=130/10 SCCM, degree of vacuum: 5 mTorr, cathode power Top/Bottom=200/60 w, substrate temperature =–5° C., etching time: 40 seconds.

The resulting patterns were inspected by a scanning-type electronmicroscope to confirm that the patterns were excellently transferred to a line size as fine as 007 μm.

As a result of measuring the thickness of each pattern using a scanning-type electron microscope, all patterns were confirmed to have a remaining under Layer film thickness of about 300 nm and a remaining patterned area thickness of about 100 nm, indicating that almost no etching had occurred in the under layer film and only about 20 μm of the patterned area was etched. Based on these results, the aspect ratio of the pattern is calculated to be (100 nm+300 nm)/70 nm=5.7, which is a very high value.

Example 31

Evaluation by Exposure to Electron Beams

The under layer film-forming composition prepared in Preparation Example 1 was applied onto a silicon wafer by spin coating to form an under layer film with a thickness of 300 nm. The film was pre-baked at 180° C. for 60 seconds, then post-baked at 300° C. for 120 seconds to form an under layer film.

The pattern-forming composition solution prepared in Preparation Example 3 was applied onto a silicon wafer substrate, on which the above under layer film had been formed, by spin coating and pre-baked for 90 seconds on a hot plate at 140° C. to form a resist film with a thickness of 100 nm.

The resist film was exposed to electron beams using a simplified electron beam direct drawing apparatus (50 keV, current density: 4.5 A), post-baked for 90 seconds on a hot plate maintained at a temperature of 110° C., and then developed in a 2.38 wt % aqueous solution of tetramethylammonium hydroxide, thereby forming a line-and-space pattern (1L/1S).

The resulting pattern was inspected by a scanning-type electron microscope to confirm that the pattern was resolved to a line size as fine as 0.07 μm.

The under layer film polymer of the present invention has excellent dry etching resistance and can be used as a thin film. When used combined with a specific pattern-forming composition exhibiting high transparency to light with a wavelength of 193 nm or less, particularly, wavelength of 193 nm and 157 nm, the polymer can form a precise pattern without producing rough pattern sides due to standing waves at a wavelength of 193 nm or less, particularly, wavelength of 193 nm and 157 nm. In addition, resist patterns with a high aspect ratio can be formed by suitably selecting a specific etching gas in the dry etching process. Therefore, the pattern forming method and the bilayer film of the present invention can greatly contribute to the lithography process that will become more and more minute in the future.

Obviously, numerous modifications and variations of the present invention are possible in light of the above teachings. It is therefore to be understood that, within the scope of the appended claims, the invention may be practiced otherwise than as specifically described herein.

What is claimed is:

1. A pattern forming method comprising steps of:
providing a film containing a polymer with a carbon content of 80 wt % or more and a polystyrene-reduced weight average molecular weight of 500–100,000,
providing a radiation-sensitive resin composition containing an acid-dissociable group-containing polysiloxane which is alkali-insoluble or scarcely alkali-soluble but becomes alkali-soluble when the acid-dissociable group dissociates,
forming a coating of the radiation-sensitive resin composition on the film, and
applying radiation to the coating;
wherein the acid-dissociable group-containing polysiloxane contains a structural unit of the following formula (2) and a structural unit of the following formula (3),

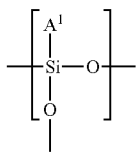

(2)

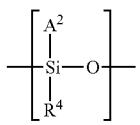

(3)

wherein $A^1$ and $A^2$ individually represent a monovalent organic group having an acid-dissociable group which dissociates by the action of an acid and $R^4$ represents a linear, branched, or cyclic alkyl group having 1–10 carbon atoms or a linear, branched, or cyclic halogenated alkyl group having 1–10 carbon atoms; and
wherein the acid-dissociable group represented by $A^1$ in the formula (2) is a group of the following formula (10),

—P—Q—R$^8$ (10)

wherein P indicates a single bond, a methylene group, a difluoromethylene group, a substituted or unsubstituted, linear or branched alkylene group having 2–20 carbon atoms, or a substituted or unsubstituted, divalent alicyclic group having 3–20 carbon atoms, Q represents a —COO— or —O— group, and $R^8$ represents a monovalent organic group dissociable by the action of an acid to produce hydrogen atoms.

2. The pattern forming method according to claim 1, wherein the polymer with a carbon content of 80 wt % or more and a polystyrene-reduced weight average molecular weight of 500–100,000 contains a structural unit of the following formula (1),

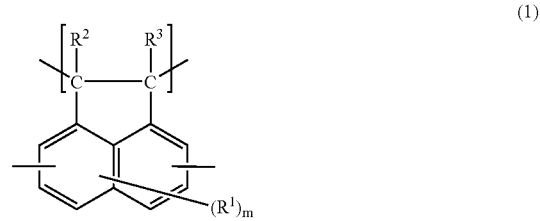

(1)

wherein $R^1$ is a monovalent atom or a monovalent group, m is an integer of 0–4 (provided that when m is 2–4, two or more $R^1$ groups may be either the same or different), and $R^2$ and $R^3$ individually represent a monovalent atom or a monovalent group.

3. The pattern forming method according to claim 1, wherein light with a wavelength of 193 nm or 157 nm is used as the radiation.

4. The pattern forming method according to claim 1, wherein the polymer with a carbon content of 80 wt % or more and a polystyrene-reduced weight average molecular weight of 500–100,000 contains a structural unit of the following formula (4),

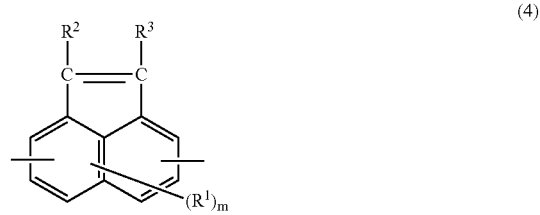

(4)

wherein $R^1$ is a monovalent atom or a monovalent group, m is an integer of 0–4 (provided that when m is 2–4, two or more $R^1$ groups may be either the same or different), and $R^2$ and $R^3$ independently represent a monovalent atom or a monovalent group.

5. The pattern forming method according to claim 1, wherein the polymer with a carbon content of 80 wt % or more and a polystyrene-reduced weight average molecular weight of 500–100,000 contains a structural unit of the following formula (5),

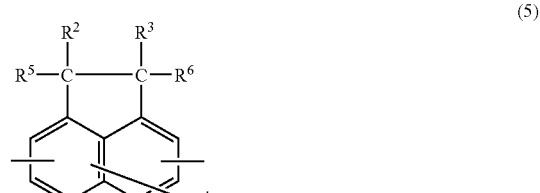

(5)

wherein $R^1$ is a monovalent atom or a monovalent group, m is an integer of 0–4 (provided that when m is 2–4, two or more $R^1$ groups may be either the same or different), and $R^2$, $R^3$, $R^5$, and $R^6$ independently represent a monovalent atom or a monovalent group.

6. The pattern forming method according to claim 1, wherein the polymer with a carbon content of 80 wt % or more and a polystyrene-reduced weight average molecular weight of 500–100,000 contains a structural unit of the following formula (6),

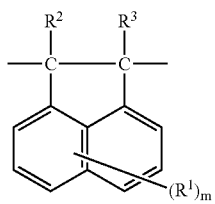 (6)

wherein $R^1$ is a monovalent atom or a monovalent group, m is an integer of 0–4 (provided that when m is 2–4, two or more $R^1$ groups may be either the same or different), and $R^2$ and $R^3$ independently represent a monovalent atom or a monovalent group.

7. A bilayer film comprising a film containing a polymer with a carbon content of 80 wt % or more and a polystyrene-reduced weight average molecular weight of 500–100,000 and a coated film applied thereon, wherein the coated film is formed from a radiation-sensitive resin composition containing an acid-dissociable group-containing polysiloxane which is alkali-insoluble or scarcely alkali-soluble but becomes alkali-soluble when the acid-dissociable group dissociates;
wherein the acid-dissociable group-containing polysiloxane contains a structural unit of the following formula (2) and a structural unit of the following formula (3),

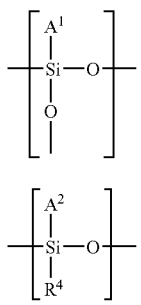 (2)

(3)

wherein $A^1$ and $A^2$ individually represent a monovalent organic group having an acid-dissociable group which dissociates by the action of an acid and $R^4$ represents a linear, branched, or cyclic alkyl group having 1–10 carbon atoms or a linear, branched, or cyclic halogenated alkyl group having 1–10 carbon atoms; and
wherein the acid-dissociable group represented by $A^1$ in the formula (2) is a group of the following formula (10),

 (10)

wherein P indicates a single bond, a methylene group, a difluoromethylene group, a substituted or unsubstituted, linear or branched alkylene group having 2–20 carbon atoms, or a substituted or unsubstituted, divalent alicyclic group having 3–20 carbon atoms, Q represents a —COO— or —O— group, and $R^8$ represents a monovalent organic group dissociable by the action of an acid to produce hydrogen atoms.

8. The bilayer film according to claim 7, wherein the acid-dissociable group represented by $A^2$ in the formula (3) is a group of the following formula 11,

 (11)

wherein P indicates a single bond, methylene group, difluoromethylene group, substituted or unsubstituted, linear or branched alkylene group having 2–20 carbon atoms, substituted or unsubstituted, divalent aromatic group having 6–20 carbon atoms, or substituted or unsubstituted, divalent alicyclic group having 3–20 carbon atoms, Q represents a group —COO— or —O—, and $R^8$ represents a monovalent organic group dissociable by the action of an acid to produce hydrogen atoms.

9. The bilayer film according to claim 7, wherein P in the formula (10) is a divalent hydrocarbon group having a norbornane skeleton or its fluoride.

10. A pattern forming method comprising steps of:
providing a film containing a polymer with a carbon content of 80 wt % or more and a polystyrene-reduced weight average molecular weight of 500–100,000,
providing a radiation-sensitive resin composition containing an acid-dissociable group-containing polysiloxane which is alkali-insoluble or scarcely alkali-soluble but becomes alkali-soluble when the acid-dissociable group dissociates,
forming a coating of the radiation-sensitive resin composition on the film, and
applying radiation to the coating;
wherein the acid-dissociable group-containing polysiloxane contains a structural unit of the following formula (2) and/or a structural unit of the following formula (3),

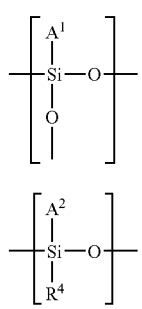 (2)

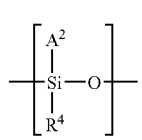 (3)

wherein $A^1$ and $A^2$ individually represent a monovalent organic group having an acid-dissociable group which dissociates by the action of an acid and $R^4$ represents a linear, branched, or cyclic alkyl group having 1–10 carbon atoms or a linear, branched, or cyclic halogenated alkyl group having 1–10 carbon atoms; and
wherein the acid-dissociable group represented by $A^1$ in the formula (2) is a group of the following formula (10),

 (10)

wherein P indicates a single bond, a methylene group, a difluoromethylene group, a substituted divalent hydrocarbon group having a tricyclodecane skeleton, a substituted divalent hydrocarbon group having an adamantane skeleton, or a substituted divalent hydrocarbon group having a norbornane skeleton, wherein the substituent(s) on the substituted divalent hydrocarbon groups are selected from the group consisting of a fluorine atom, a linear fluoroalkyl group having 1–10 carbon atoms, a branched fluoroalkyl group having 1–10 carbon atoms and combinations thereof, Q represents a —COO— or —O— group, and $R^8$ represents a monovalent organic group dissociable by the action of an acid to produce hydrogen atoms.

11. The pattern forming method according to claim 10, wherein the polymer with a carbon content of 80 wt % or more and a polystyrene-reduced weight average molecular weight of 500–100,000 contains a structural unit of the following formula (1),

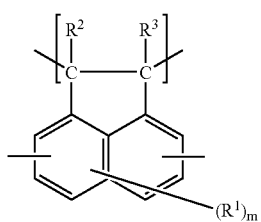

(1)

wherein $R^1$ is a monovalent atom or a monovalent group, m is an integer of 0–4 (provided that when m is 2–4, two or more $R^1$ groups may be either the same or different), and $R^2$ and $R^3$ individually represent a monovalent atom or a monovalent group.

12. The pattern forming method according to claim 10, wherein light with a wavelength of 193 nm or 157 nm is used as the radiation.

13. The pattern forming method according to claim 10, wherein the polymer with a carbon content of 80 wt % or more and a polystyrene-reduced weight average molecular weight of 500–100,000 contains a structural unit of the following formula (4),

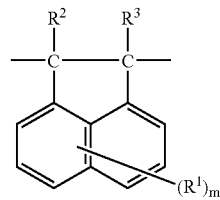

(4)

wherein $R^1$ is a monovalent atom or a monovalent group, m is an integer of 0–4 (provided that when m is 2–4, two or more $R^1$ groups may be either the same or different), and $R^2$ and $R^3$ independently represent a monovalent atom or a monovalent group.

14. The pattern forming method according to claim 10, wherein the polymer with a carbon content of 80 wt % or more and a polystyrene-reduced weight average molecular weight of 500–100,000 contains a structural unit of the following formula (5),

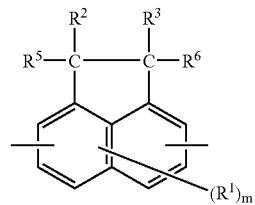

(5)

wherein $R^1$ is a monovalent atom or a monovalent group, m is an integer of 0–4 (provided that when m is 2–4, two or more $R^1$ groups may be either the same or different), and $R^2$, $R^3$, $R^5$, and $R^6$ independently represent a monovalent atom or a monovalent group.

15. The pattern forming method according to claim 10, wherein the polymer with a carbon content of 80 wt % or more and a polystyrene-reduced weight average molecular weight of 500–100,000 contains a structural unit of the following formula (6),

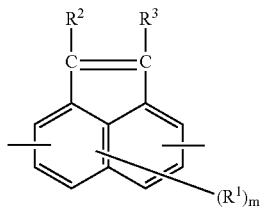

(6)

wherein $R^1$ is a monovalent atom or a monovalent group, m is an integer of 0–4 (provided that when m is 2–4, two or more $R^1$ groups may be either the same or different), and $R^2$ and $R^3$ independently represent a monovalent atom or a monovalent group.

16. A pattern forming method comprising steps of:
providing a film containing a polymer with a carbon content of 80 wt % or more and a polystyrene-reduced weight average molecular weight of 500–100,000,
providing a radiation-sensitive resin composition containing an acid-dissociable group-containing polysiloxane which is alkali-insoluble or scarcely alkali-soluble but becomes alkali-soluble when the acid-dissociable group dissociates,
forming a coating of the radiation-sensitive resin composition on the film, and
applying radiation to the coating;
wherein the acid-dissociable group-containing polysiloxane contains a structural unit of the following formula (2) and/or a structural unit of the following formula (3),

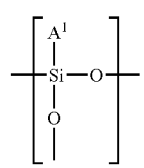

(2)

-continued

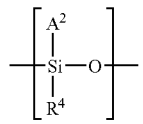
(3)

wherein $A^1$ and $A^2$ individually represent a monovalent organic group having an acid-dissociable group which dissociates by the action of an acid and $R^4$ represents a linear, branched, or cyclic alkyl group having 1–10 carbon atoms or a linear, branched, or cyclic halogenated alkyl group having 1–10 carbon atoms; and wherein the acid-dissociable group represented by $A^1$ in the formula (2) is a group of the following formula (10),

—P-Q-$R^8$ (10)

wherein:
P represents: a single bond; a methylene group; a difluoromethylene group; a linear or branched alkylene group having 2–20 carbon atoms which is unsubstituted or which is substituted with a fluorine atom or a fluoralkyl group having 1 to 10 carbon atoms; or a divalent alicyclic group having 3–20 carbon atoms which is substituted with a
fluorine atom or a fluoralkyl group having 1 to 10 carbon atoms;
Q represents a —COO— or —O— group; and
$R^8$ represents a monovalent organic group dissociable by the action of an acid to produce hydrogen atoms.

17. The pattern forming method according to claim 16, wherein the polymer with a carbon content of 80 wt % or more and a polystyrene-reduced weight average molecular weight of 500–100,000 contains a structural unit of the following formula (1),

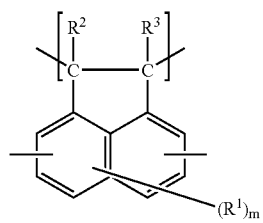
(1)

wherein $R^1$ is a monovalent atom or a monovalent group, m is an integer of 0–4 (provided that when m is 2–4, two or more groups may be either the same or different), and $R^2$ and $R^3$ individually represent a monovalent atom or a monovalent group.

18. The pattern forming method according to claim 16, wherein light with a wavelength of 193 nm or 157 nm is used as the radiation.

19. The pattern forming method according to claim 16, wherein the polymer with a carbon content of 80 wt % or more and a polystyrene-reduced weight average molecular weight of 500–100,000 contains a structural unit of the following formula (4),

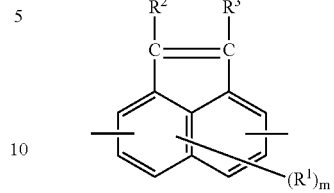
(4)

wherein $R^1$ is a monovalent atom or a monovalent group, m is an integer of 0–4 (provided that when m is 2–4, two or more $R^1$ groups may be either the same or different), and $R^2$ and $R^3$ independently represent a monovalent atom or a monovalent group.

20. The pattern forming method according to claim 16, wherein the polymer with a carbon content of 80 wt % or more and a polystyrene-reduced weight average molecular weight of 500–100,000 contains a structural unit of the following formula (5),

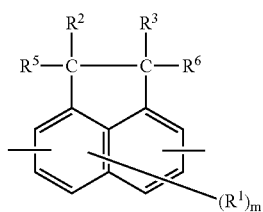
(5)

wherein $R^1$ is a monovalent atom or a monovalent group, m is an integer of 0–4 (provided that when m is 2–4, two or more $R^1$ groups may be either the same or different), and $R^2$, $R^3$, $R^5$, and $R^6$ independently represent a monovalent atom or a monovalent group.

21. The pattern forming method according to claim 16, wherein the polymer with a carbon content of 80 wt % or more and a polystyrene-reduced weight average molecular weight of 500–100,000 contains a structural unit of the following formula (6),

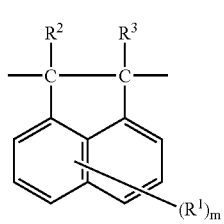
(6)

wherein $R^1$ is a monovalent atom or a monovalent group, m is an integer of 0–4 (provided that when m is 2–4, two or more $R^1$ groups may be either the same or different), and R and $R^3$ independently represent a monovalent atom or a monovalent group.

* * * * *

UNITED STATES PATENT AND TRADEMARK OFFICE
CERTIFICATE OF CORRECTION

PATENT NO. : 7,244,549 B2 Page 1 of 1
APPLICATION NO. : 10/226321
DATED : July 17, 2007
INVENTOR(S) : Iwasawa et al.

It is certified that error appears in the above-identified patent and that said Letters Patent is hereby corrected as shown below:

Column 54, line 61: "R" should read -- $R^2$ --

Signed and Sealed this

Twenty-third Day of October, 2007

JON W. DUDAS
*Director of the United States Patent and Trademark Office*